United States Patent
Lu

(10) Patent No.: US 10,886,233 B2
(45) Date of Patent: Jan. 5, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/264,603

(22) Filed: Jan. 31, 2019

(65) Prior Publication Data
US 2020/0251420 A1  Aug. 6, 2020

(51) Int. Cl.
*H01L 23/544* (2006.01)
*H01L 23/31* (2006.01)
*H01L 21/56* (2006.01)

(52) U.S. Cl.
CPC ........... *H01L 23/544* (2013.01); *H01L 21/56* (2013.01); *H01L 23/3107* (2013.01); *H01L 2223/54426* (2013.01)

(58) Field of Classification Search
CPC ... H01L 23/544; H01L 23/3107; H01L 21/56; H01L 2223/54426
See application file for complete search history.

(56) References Cited

U.S. PATENT DOCUMENTS

| | | | |
|---|---|---|---|
| 10,504,852 B1 * | 12/2019 | Chen | H01L 24/20 |
| 2010/0252188 A1 * | 10/2010 | Inanami | G03F 7/0002 156/280 |
| 2011/0180922 A1 * | 7/2011 | Chen | H01L 23/544 257/700 |
| 2012/0299159 A1 * | 11/2012 | Chen | G03F 9/7084 257/620 |
| 2017/0084545 A1 * | 3/2017 | Seddon | H01L 24/00 |

\* cited by examiner

*Primary Examiner* — Yasser A Abdelaziez
(74) *Attorney, Agent, or Firm* — Foley & Lardner LLP

(57) ABSTRACT

A semiconductor device package is provided, which includes a substrate, a semiconductor device and an alignment structure. The semiconductor device and the alignment structure are disposed on the substrate. The alignment structure is in direct contact with the semiconductor device.

19 Claims, 35 Drawing Sheets

SEMICONDUCTOR DEVICE PACKAGE AND METHOD OF MANUFACTURING THE SAME

TECHNICAL FIELD

The present disclosure generally relates to a semiconductor device package and method of manufacturing the same.

BACKGROUND

Techniques (e.g. placing technique, bonding technique, etc.) are used to manufacture a semiconductor device package. Accuracy of placement or bonding is desired in the trend of miniaturization.

Deviation occurs when placing or bonding components and semiconductor device(s) to a carrier due to mechanical tolerance, optical tolerance, and so on.

Moreover, structural constraint (e.g. size) of manufacturing tool(s) or equipment(s) may hinder miniaturization of the semiconductor device package.

SUMMARY

Some embodiments of the subject application provide a semiconductor device package, which includes a substrate, a first semiconductor device and a first alignment structure. The first semiconductor device is disposed on the substrate. The first alignment structure is disposed on the substrate. The first alignment structure is in direct contact with the first semiconductor device.

Some embodiments of the subject application provides a semiconductor device package, which includes a substrate, a first semiconductor device, a first conductive structure disposed on the substrate, a first conductive structure disposed on the semiconductor device and a connection element. The connection element is disposed between the first conductive structure on the substrate and the first conductive structure on the semiconductor device. The first connection element has a relatively great volume at a first side.

Some embodiments of the subject application provide a method of manufacturing a semiconductor device package. The method includes providing a substrate having a first conductive structure disposed on the substrate. The method further includes forming a first alignment structure on the substrate. The method further includes supplying fluid on the substrate. The method further includes placing a first semiconductor device having a first conductive structure on the fluid.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
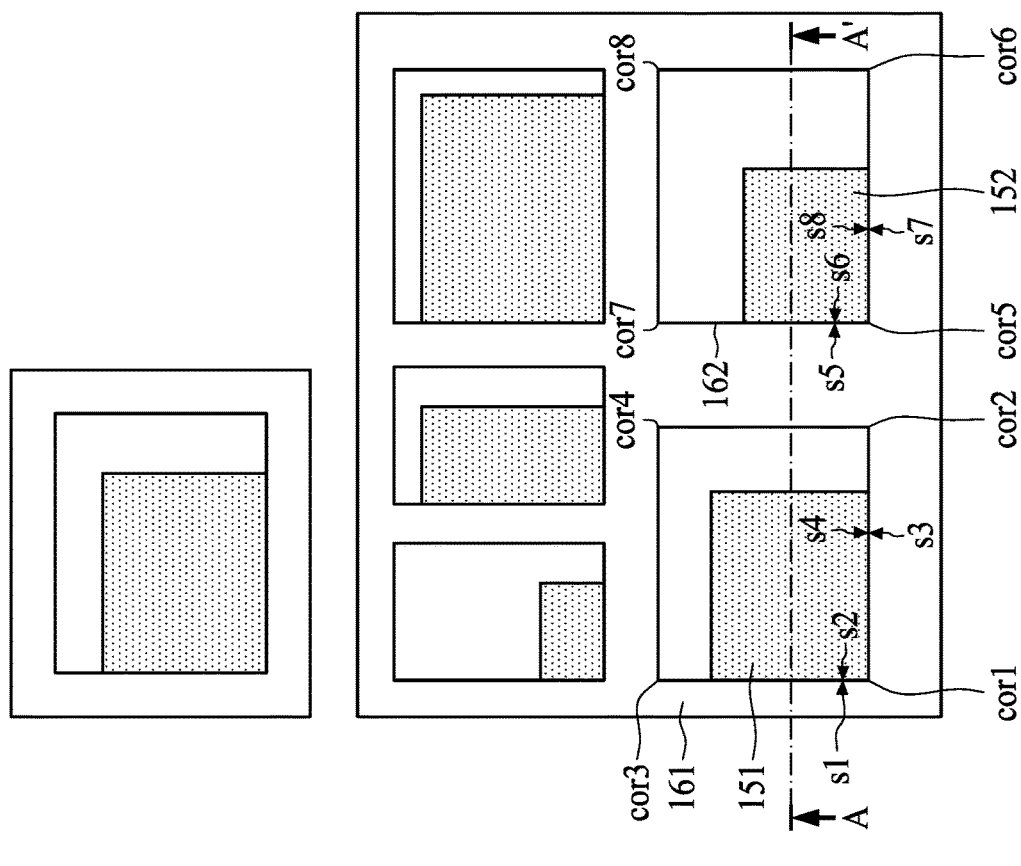
FIG. 1A illustrates a top view of a semiconductor device package in accordance with some embodiments of the subject application.

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

FIG. 1A illustrates a top view of a semiconductor device package in accordance with some embodiments of the subject application.

Referring to FIG. 1A, the semiconductor device package 1a includes semiconductor devices 151, 152 and alignment structures 161, 162. It is contemplated that FIG. 1A merely illustrates a layout of semiconductor devices and alignment structures for simplicity, and the structure of the semiconductor device package 1a will be further detailed below with the accompanying FIG. 1B.

The semiconductor devices, which are not denoted in FIG. 1A, may be same or similar to semiconductor device 151 or semiconductor device 152. The semiconductor devices, which are not denoted in FIG. 1A, may be different from semiconductor device 151 or semiconductor device 152. The semiconductor devices 151 and 152 may include, for example but not limited to, a semiconductor die (or chip) having circuit integrated therein or the like. The semiconductor device 151 may be different in size from the semiconductor device 152. The semiconductor device 151 may be different from the semiconductor device 152. The semiconductor device 151 may be same or similar to the semiconductor device 152 in some other embodiments of the subject application.

The alignment structures, which are not denoted in FIG. 1A, may be same or similar to alignment structure 161 or alignment structure 162. The alignment structures, which are not denoted in FIG. 1A, may be different from alignment structure 161 or alignment structure 162. The alignment structure (e.g. 161) may define a space, a cavity or a room to accommodate a semiconductor device (e.g. 151). Some alignment structures may be formed in one piece. One alignment structure may be separate from another alignment structure by a distance or a space. One alignment structure may be independent of another alignment structure. One alignment structure (e.g. 161) may be same or similar to another alignment structure (e.g. 162). One alignment structure may be different from another alignment structure.

The alignment structure 161 may have a rectangular shape or the like. Similarly, the alignment structure 162 may have a rectangular shape or the like.

The alignment structure 161 encloses the semiconductor device 151. The alignment structure 161 is in direct contact with the semiconductor device 151. A side s1 of the alignment structure 161 is in direct contact with a side s2 of the semiconductor device 151. A side s3 of the alignment structure 161 is in direct contact with a side s4 of the semiconductor device 151. The side s1 of the alignment structure 161 is adjacent to the side s3 of the alignment structure 161. The side s2 of the semiconductor device 151 is adjacent to the side s4 of the semiconductor device 151.

The alignment 161 has corners cor1, cor2, cor3, cor4. The semiconductor device 151 is placed adjacent to the corner cor1. The semiconductor device 151 is in direct contact to the corner cor1. The corner cor1 is opposite the corner cor2. The corner cor1 is opposite the corner cor3. The corner cor1 is opposite the corner cor4.

The alignment structure 162 encloses the semiconductor device 152. The alignment structure 162 is in direct contact with the semiconductor device 152. A side s5 of the alignment structure 162 is in direct contact with a side s6 of the semiconductor device 152. Another side s7 of the alignment structure 162 is in direct contact with another side s8 of the semiconductor device 152. The side s5 of the alignment structure 162 is adjacent to the side s7 of the alignment structure 162. The side s6 of the semiconductor device 152 is adjacent to the side s8 of the semiconductor device 152.

The alignment 162 has corners cor5, cor6, cor7, cor8. The semiconductor device 152 is placed adjacent to the corner cor5. The semiconductor device 152 is in direct contact with the corner cor5. The corner cor5 is opposite the corner cor2. The corner cor5 is opposite the corner cor6. The corner cor5 is opposite the corner cor7. The corner cor5 is opposite the corner cor8. Although not illustrated, it is contemplated that the semiconductor device package 1a may include more alignment structures.

Each of the semiconductor devices as shown in FIG. 1A is disposed at a same corner (e.g. bottom left corner as shown in FIG. 1A) of an alignment structure.

Figure 1B:
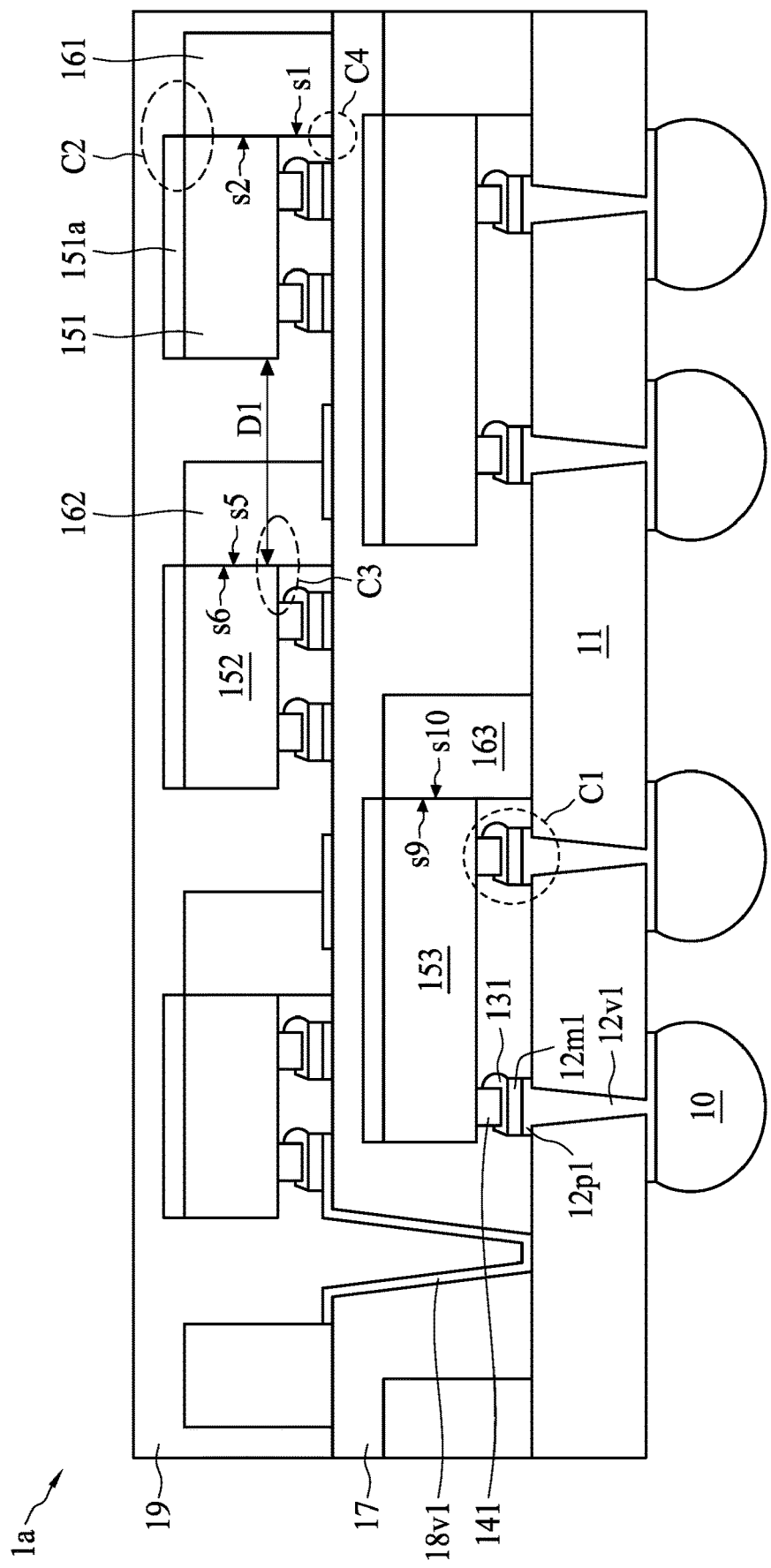
FIG. 1B illustrate illustrates a cross-sectional view of a semiconductor device package in accordance with some embodiments of the subject application.

FIG. 1B illustrates a cross-sectional view of a semiconductor device package 1a across line AA' as shown in FIG. 1A in accordance with some embodiments of the subject application.

Referring to FIG. 1B, the semiconductor device package 1a includes connection elements 10 and 131, a substrate 11, conductive structures 12p1 and 141, layers 12m1 and 18v1, encapsulants 17 and 19, semiconductor devices 151, 152 and 153 and alignment structures 161, 162 and 163.

The substrate 11 may include circuitry (not illustrated in FIG. 1B) therein and/or thereon. The substrate 11 may include conductive traces (not illustrated in FIG. 1B). The substrate 11 may include conductive pads (not illustrated in FIG. 1B). The substrate 11 may include semiconductor material. The substrate 11 may include conductive material. The substrate 11 may include insulation material (e.g. dielectric material). The substrate 11 may include a redistribution (RDL) structure(s). The substrate 11 may include ceramic, bismaleimide triazine (BT), FR4, prepreg (PP) or other suitable materials. The substrate 11 may include opaque material.

The substrate 11 may include a conductive via 12v1. The conductive via 12v1 may include conductive material, for example but not limited to, copper or other suitable materials.

The connection element 10 is disposed on the substrate 11. The connection element 10 is disposed on the conductive via 12v1. The connection element 10 may include an alloy of gold and tin solder. The connection element 10 may include an alloy of silver and tin solder. The connection element 10 may include solder, copper or other suitable material.

The semiconductor device 153 is disposed on the substrate 11. The semiconductor device 153 may include, for example but not limited to, a semiconductor die (or chip) having a circuit integrated therein or the like.

The alignment structure 163 is disposed on the substrate 11. The alignment structure 163 is in direct contact with the semiconductor device 153. A side s10 of the alignment structure 163 is in direct contact with a side s9 of the semiconductor device 153. The alignment structure 163 may include, for example but not limited to, optical curable material.

The conductive structure 12p1 is disposed on the substrate 11. The conductive structure 12p1 is disposed on the conductive via 12v1. The conductive via 12v1 may be, for example but not limited to, a conductive pad.

The conductive structure 12p1 is disposed on the conductive via 12v1. The layer 12m1 is disposed on the conductive structure 12p1. The layer 12m1 may include a barrier layer. The conductive structure 141 is disposed under the semiconductor device 153.

The conductive structure 12p1 may be, for example but not limited to, a conductive pad. The conductive structure 141 may be, for example but not limited to, a conductive pillar.

The connection element 131 is disposed between the conductive structure 141 and the layer 12m1. The semiconductor device 153 is electrically connected to the connection element 10 through the conductive structures 12p1, 141, the connection element 131, the layer 12m1 and the conductive via 12v1.

The connection element 131 has an asymmetrical structure. One side of the connection element 131 has a relatively greater volume. The connection element 131 has a greater volume at a side which is relatively close or adjacent to the alignment structure 163. The connection element 131 has a greater volume at a side which is relatively close or adjacent to the side s10 of the alignment structure 163. The connection element 131 has a greater volume at a side which is relatively close or adjacent to a side (not denoted in FIG. 1B) adjacent to the side s10 of the alignment structure 163. The connection element 131 has a greater volume at a side which is relatively close or adjacent to a corner (not denoted in FIG. 1B) of the alignment structure 163. The connection element 131 has a greater volume at a side which is relatively close or adjacent to a corner of the alignment structure 163, and the corner is an intersection of two sides of the alignment structure 163.

The connection element 10 may be, for example but not limited to, a ball type connection element. The connection elements 131 may include an alloy of gold and tin solder. The connection elements 131 may include an alloy of silver and tin solder.

The encapsulant 17 is disposed on the substrate 11. The encapsulant 17 covers the semiconductor device 153. The encapsulant 17 covers the alignment structure 163. The encapsulant 17 covers the substrate 11. The encapsulant 17 may include epoxy. The encapsulant 17 may include fillers or particles.

The layer 18v1 is disposed on the encapsulant 17. Although not illustrated, it is contemplated that the conductive via may be patterned to provide electrical connections.

The semiconductor device 151 is disposed on the encapsulant 17. The semiconductor device 151 may include, for example but not limited to, a semiconductor die (or chip) having a circuit integrated therein or the like. A conductive layer 151a is disposed on the semiconductor device 151.

The alignment structure 161 is disposed on the encapsulant 17. The alignment structure 161 is in direct contact with the semiconductor device 151. A side s1 of the alignment structure 161 is in direct contact with a side s2 of the semiconductor device 151.

The semiconductor device 152 is disposed on the encapsulant 17. The semiconductor device 152 may include, for example but not limited to, a semiconductor die (or chip) having a circuit integrated therein or the like.

The alignment structure 162 is disposed on the encapsulant 17. The alignment structure 162 is in direct contact with the semiconductor device 152. A side s5 of the alignment structure 162 is in direct contact with a side s6 of the semiconductor device 152. The alignment structure 162 may include, for example but is not limited to, optical curable material.

The side s1 of the alignment structure 161 faces the same direction as the side s5 of the alignment structure 162. The side s2 of the semiconductor device 151 faces the same direction as the side s6 of the semiconductor device 152.

A connection element (not denoted in FIG. 1B) is disposed between the semiconductor device 151 and the encapsulant 17 has an asymmetrical shape. One side of the connection element has a relatively greater volume. The connection element has a greater volume at a side which is relatively close or adjacent to the alignment structure 161. The connection element has a greater volume at a side which is relatively close or adjacent to the side s1 of the alignment structure 161. The connection element has a greater volume at a side which is relatively close or adjacent to a side s3 (as shown in FIG. 1A) adjacent to the side s1 of the alignment structure 161. The connection element has a greater volume at a side which is relatively close or adjacent to a corner cor1 (as shown in FIG. 1A) of the alignment structure 161. The connection element has a greater volume at a side which is relatively close or adjacent to a corner cor1 of the alignment structure 161, and the corner cor1 is an intersection of two sides s1, s3 of the alignment structure 161.

In some embodiments, the distance D1 between the semiconductor device 151 and 152 may be less than 2 mm. In some embodiments, the distance D1 between the semiconductor device 151 and 152 may be less than 1 mm.

The encapsulant 19 is disposed on the encapsulant 17. The encapsulant 19 covers the encapsulant 17. The encapsulant 19 covers the semiconductor device 151. The encapsulant 19 covers the semiconductor device 152. The encapsulant 19 covers the alignment structure 161. The encapsulant 19 covers the alignment structure 162.

Figure 1C:
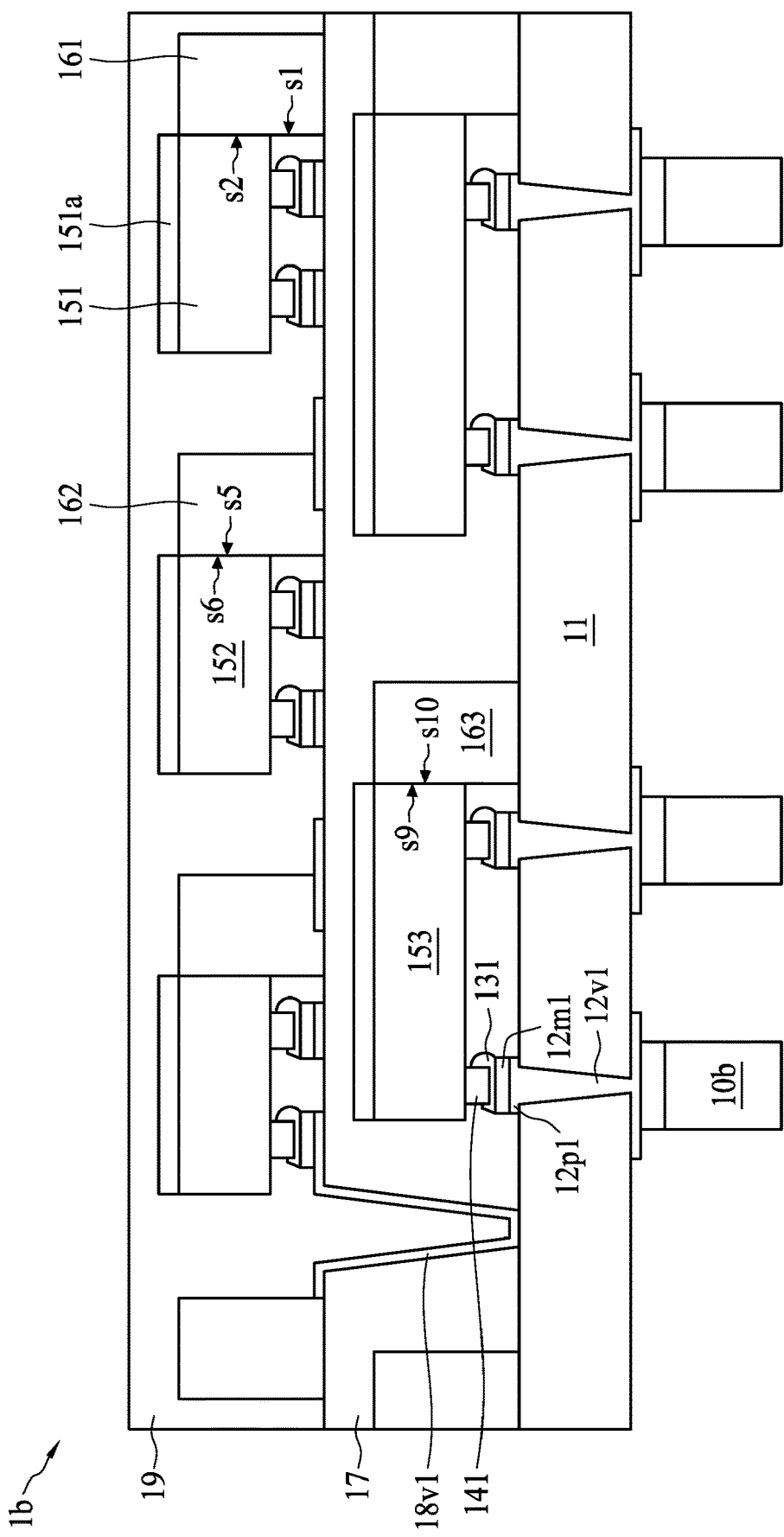
FIG. 1C illustrate illustrates a cross-sectional view of a semiconductor device package in accordance with some embodiments of the subject application.

FIG. 1C illustrates a cross-sectional view of a semiconductor device package 1b in accordance with some embodiments of the subject application.

Referring to FIG. 1C, the semiconductor device package 1b is similar to the semiconductor device package 1a except that the connection element 10 of the semiconductor device 1a is replaced by the connection element 10b of the semiconductor device package 1b.

The connection element 10b may be, for example but not limited to, a bump type connection element. The connection element 10b is electrically connected to the semiconductor device 153.

Figure 1D:
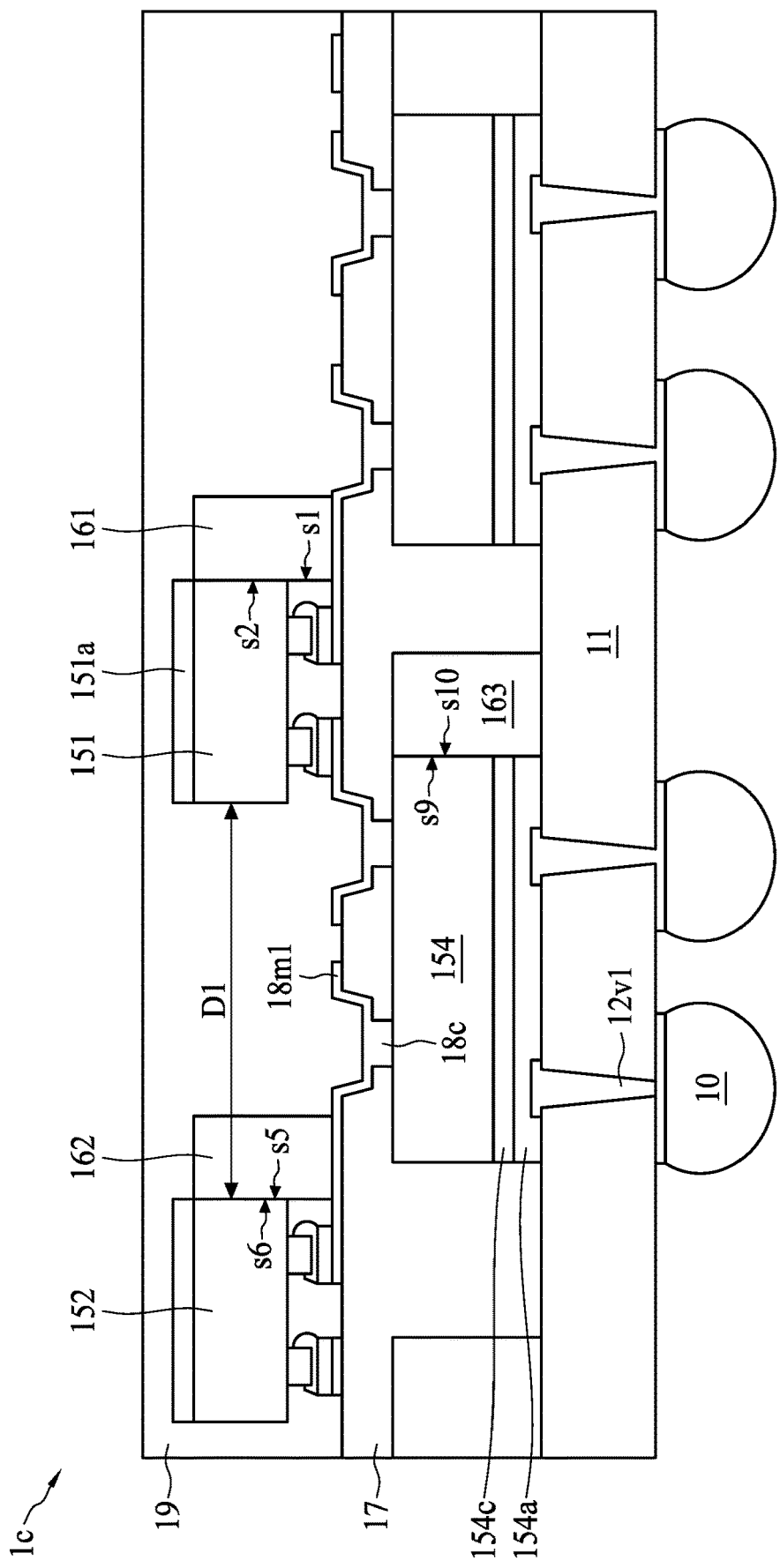
FIG. 1D illustrates a cross-sectional view of a semiconductor device package in accordance with some embodiments of the subject application.

FIG. 1D illustrates a cross-sectional view of a semiconductor device package 1c in accordance with some embodiments of the subject application.

Referring to FIG. 1D, the semiconductor device package 1c includes a connection element 10, a substrate 11, a conductive via 12v1, a conductive structure 18c, a layer 18m1, an adhesive layer 154a, a conductive layer 154c, semiconductor devices 151, 152, 154, alignment structures 161, 162, 163 and encapsulants 17, 19.

The substrate 11 may include circuitry (not illustrated in FIG. 1D) therein and/or thereon. The substrate 11 may include conductive traces (not illustrated in FIG. 1D). The substrate 11 may include conductive pads (not illustrated in FIG. 1D). The substrate 11 may include semiconductor material. The substrate 11 may include conductive material. The substrate 11 may include insulation material (e.g. dielectric material). The substrate 11 may include an RDL structure(s). The substrate 11 may include ceramic, bismaleimide triazine (BT), FR4, prepreg (PP) or other suitable materials. The substrate 11 may include opaque material.

The substrate 11 may include the conductive via 12v1. The conductive via 12v1 may be filled with conductive material, for example but not limited to, copper or other suitable materials.

The connection element 10 is disposed under the substrate 11. The connection element 10 is disposed under the conductive via 12v1. The connection element 10 may include an alloy of gold and tin solder. The connection element 10 may include an alloy of silver and tin solder. The connection element 10 may include solder, copper or other suitable materials.

The semiconductor device 154 is disposed on the substrate 11. The semiconductor device 154 is disposed on the adhesive layer 154a. The conductive layer 154c of the semiconductor device 154 is in direct contact with the adhesive layer 154a.

The semiconductor device 154 may include, for example but not limited to, a semiconductor die (or chip) having a circuit integrated therein or the like. The connection element 131 may include solder, copper or other suitable materials.

The alignment structure 163 is disposed on the substrate 11. The alignment structure 163 is in direct contact with the semiconductor device 154. A side s10 of the alignment structure 163 is in direct contact with a side s9 of the semiconductor device 154. The alignment structure 163 may include, for example but not limited to, optical curable material.

The encapsulant 17 is disposed on the substrate 11. The encapsulant 17 covers the semiconductor device 154. The encapsulant 17 covers the alignment structure 163. The encapsulant 17 covers the substrate 11. The encapsulant 17 may include epoxy. The encapsulant 17 may include fillers or particles.

The conductive structure 18c is disposed on the semiconductor device 154. The conductive structure 18c is surrounded by the encapsulant 17. The layer 18m1 is disposed on the encapsulant 17. The conductive structures 18c and the layer 18m1 provide electrical connections for the semiconductor device 154.

The semiconductor device 151 is disposed on the encapsulant 17. The semiconductor device 151 may include, for example but not limited to, a semiconductor die (or chip) having a circuit integrated therein or the like. The semiconductor device 151 is electrically connected to the semiconductor device 154.

The alignment structure 161 is disposed on the encapsulant 17. The alignment structure 161 is in direct contact with the semiconductor device 151. A side s1 of the alignment structure 161 is in direct contact with a side s2 of the semiconductor device 151.

The semiconductor device 152 is disposed on the encapsulant 17. The semiconductor device 152 may include, for example but not limited to, a semiconductor die (or chip) having a circuit integrated therein or the like. The semiconductor device 152 is electrically connected to the semiconductor device 154.

The alignment structure 162 is disposed on the encapsulant 17. The alignment structure 162 is in direct contact with the semiconductor device 152. A side s5 of the alignment structure 162 is in direct contact with a side s6 of the semiconductor device 152. The alignment structure 162 may include, for example but not limited to, optical curable material.

The side s1 of the alignment structure 161 faces the same direction as the side s5 of the alignment structure 162. The side s2 of the semiconductor device 151 faces the same direction as the side s6 of the semiconductor device 152.

A connection element (not denoted in FIG. 1D) is disposed between the semiconductor device 151 and the encapsulant 17 has an asymmetrical shape. One side of the connection element has a relatively greater volume. The connection element has a greater volume at a side which is relatively close or adjacent to the alignment structure 161. The connection element has a greater volume at a side which is relatively close or adjacent to the side s1 of the alignment structure 161. The connection element has a greater volume at a side which is relatively close or adjacent to the side s3 (as shown in FIG. 1A) adjacent to the side s1 of the alignment structure 161. The connection element has a greater volume at a side which is relatively close or adjacent to a corner cor1 (as shown in FIG. 1A) of the alignment structure 161. The connection element has a greater volume at a side which is relatively close or adjacent to a corner cor1 of the alignment structure 161, and the corner cor1 is an intersection of two sides s1, s3 of the alignment structure 161.

The distance D1 between the semiconductor device 151 and 152 may be less than 2 mm.

An encapsulant 19 is disposed on the encapsulant 17. The encapsulant 19 covers the encapsulant 17. The encapsulant 19 covers the semiconductor device 151. The encapsulant 19 covers the semiconductor device 152. The encapsulant 19 covers the alignment structure 161. The encapsulant 19 covers the alignment structure 162.

Figure 1E:
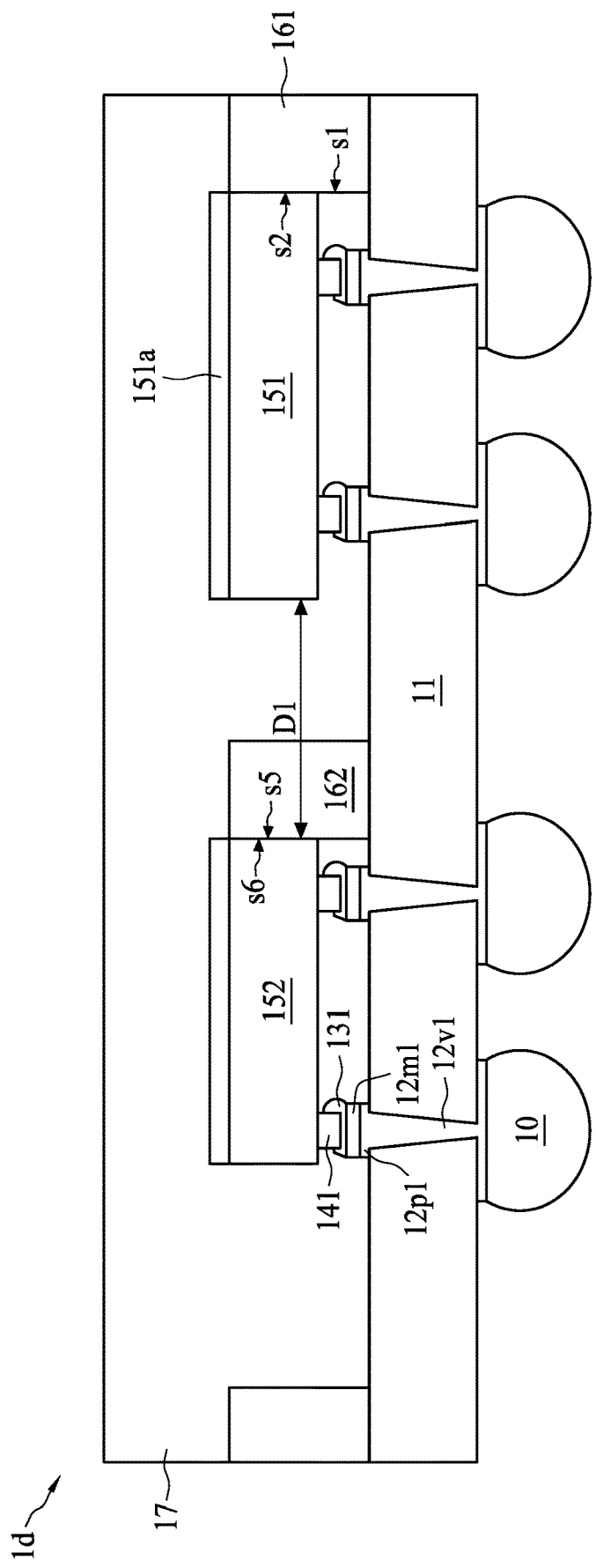
FIG. 1E illustrate illustrates a cross-sectional view of a semiconductor device package in accordance with some embodiments of the subject application.

FIG. 1E illustrates a cross-sectional view of a semiconductor device package 1d in accordance with some embodiments of the subject application.

Referring to FIG. 1E, the semiconductor device package 1d with a single layer is provided. The semiconductor device package 1d includes connection elements 10, 131, a substrate 11, conductive vias 12v1, conductive structures 12p1, 141, layers 12m1, semiconductor devices 151, 152, alignment structures 161, 162 and an encapsulant 17.

The substrate 11 may include circuitry (not illustrated in FIG. 1E) therein and/or thereon. The substrate 11 may include conductive traces (not illustrated in FIG. 1B). The substrate 11 may include conductive pads (not illustrated in FIG. 1E). The substrate 11 may include semiconductor material. The substrate 11 may include conductive material. The substrate 11 may include insulation material (e.g. dielectric material). The substrate 11 may include an RDL structure(s). The substrate 11 may include ceramic, bismaleimide triazine (BT), FR4, prepreg (PP) or other suitable materials. The substrate 11 may include opaque material.

The substrate 11 may include the conductive via 12v1. The conductive via 12v1 may be filled with conductive material, for example but not limited to, copper or other suitable materials.

The connection element 10 is disposed under the substrate 11. The connection element 10 is disposed under the conductive via 12v1. The connection element 10 may include an alloy of gold and tin solder. The connection element 10 may include an alloy of silver and tin solder. The connection element 10 may include solder, copper or other suitable materials.

The semiconductor device 151 is disposed on the substrate 11. The semiconductor device 152 is disposed on the substrate 11.

The semiconductor devices 151 and 152 may include, for example but not limited to, a semiconductor die (or chip) having a circuit integrated therein or the like.

The alignment structure 161 is disposed on the substrate 11. The alignment structure 161 is in direct contact with the semiconductor device 151. A side s1 of the alignment structure 161 is in direct contact with a side s2 of the semiconductor device 151. The alignment structure 161 may include, for example but not limited to, optical curable material.

The alignment structure 162 is disposed on the substrate 11. The alignment structure 162 is in direct contact with the semiconductor device 152. A side s5 of the alignment structure 162 is in direct contact with a side s6 of the semiconductor device 152. The alignment structure 162 may include, for example but not limited to, optical curable material.

The conductive structure 12p1 is disposed on the substrate 11. The conductive structure 12p1 is disposed on the conductive via 12v1. The conductive via 12v1 may be, for example but not limited to, a conductive pad.

The conductive structure 12p1 is disposed on the conductive via 12v1. The layer 12m1 is disposed on the conductive structure 12p1. The conductive structure 141 is disposed under the semiconductor device 152.

The conductive structure 12p1 may be, for example but not limited to, a conductive pad. The conductive structure 141 may be, for example but not limited to, a conductive pillar.

The connection element 131 is disposed between the conductive structure 141 and the layer 12m1. The semiconductor device 152 is electrically connected to the connection element 10 through the conductive structures 12p1, 141, the connection element 131, the layer 12m1 and the conductive via 12v1.

The connection element 131 has an asymmetrical shape. One side of the connection element 131 has a relatively greater volume. The connection element 152 has a greater volume at a side which is relatively close or adjacent to the alignment structure 162. The connection element has a greater volume at a side which is relatively close or adjacent to the side s5 of the alignment structure 162. The connection element has a greater volume at a side which is relatively close or adjacent to the side s7 (as shown in FIG. 1A) adjacent to the side s5 of the alignment structure 162. The connection element has a greater volume at a side which is relatively close or adjacent to a corner cor5 (as shown in FIG. 1A) of the alignment structure 162. The connection element has a greater volume at a side which is relatively close or adjacent to a corner cor5 of the alignment structure 162, and the corner cor5 is an intersection of two sides s5, s7 of the alignment structure 162.

The connection element 131 may include an alloy of gold and tin solder. The connection element 131 may include an alloy of silver and tin solder. The connection element 131 may include solder, copper or other suitable materials.

The encapsulant 17 is disposed on the substrate 11. The encapsulant 17 covers the semiconductor device 151. The encapsulant 17 covers the semiconductor device 152. The encapsulant 17 covers the alignment structure 161. The encapsulant 17 covers the alignment structure 162. The encapsulant 17 covers the substrate 11. The encapsulant 17 may include epoxy. The encapsulant 17 may include fillers or particles.

Figure 1F:
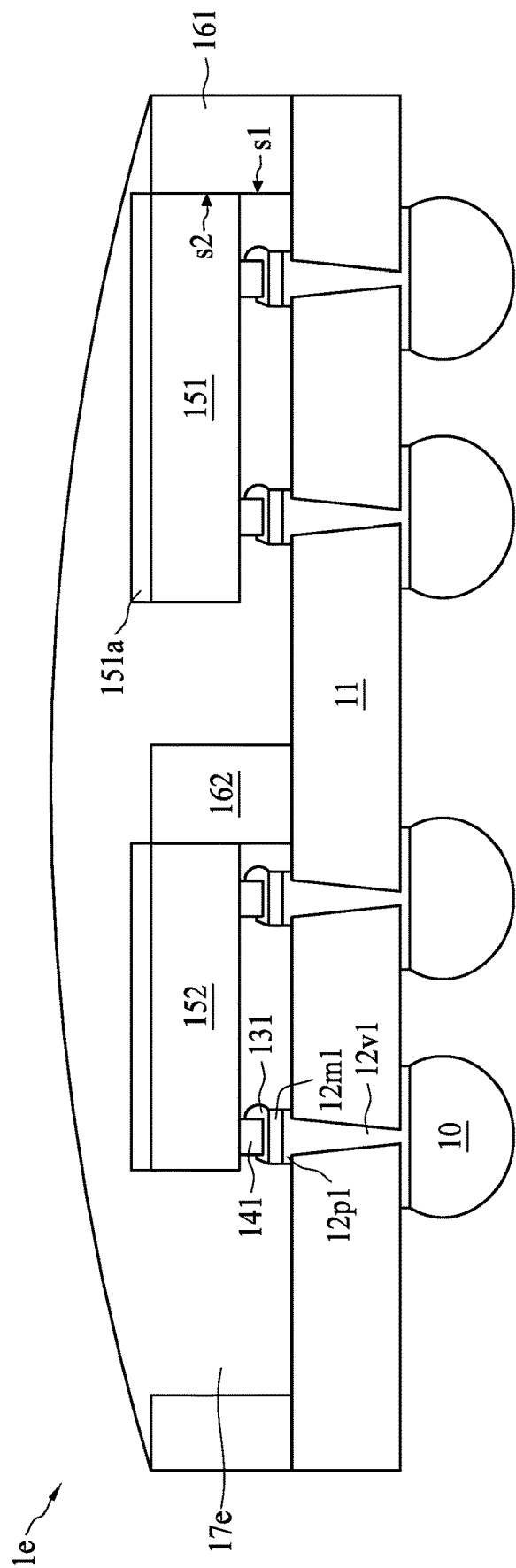
FIG. 1F illustrate illustrates a cross-sectional view of a semiconductor device package in accordance with some embodiments of the subject application.

FIG. 1F illustrates a cross-sectional view of a semiconductor device package 1e in accordance with some embodiments of the subject application.

Referring to FIG. 1F, the semiconductor device 1e is similar to the semiconductor device package 1d shown in FIG. 1E, except that the encapsulant 17 of the semiconductor device package 1d is replaced by the encapsulant 17e of the semiconductor device package 1e.

The encapsulant 17e includes, for example but not limited to, a potting compound. The encapsulant 17e has a relatively round top surface (not denoted in FIG. 1F) compared to the encapsulant 17 illustrated and described with reference to FIG. 1E.

Figure 2B:
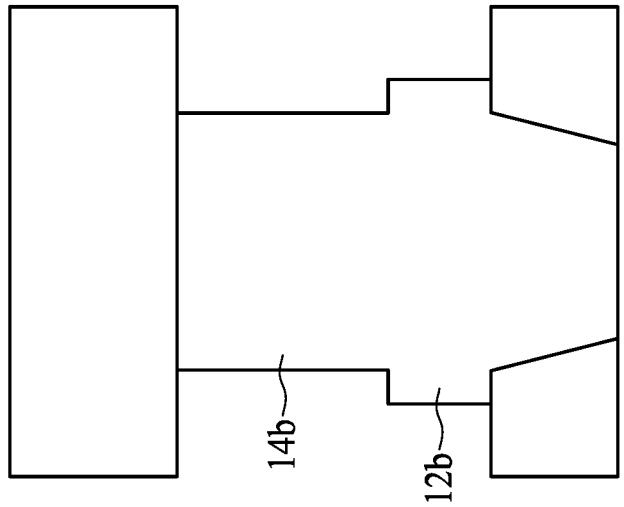
FIG. 2B illustrates an enlarged view of a structure which may replace the structure as shown in FIG. 2A in accordance with some embodiments of the subject application.
Figure 2A:
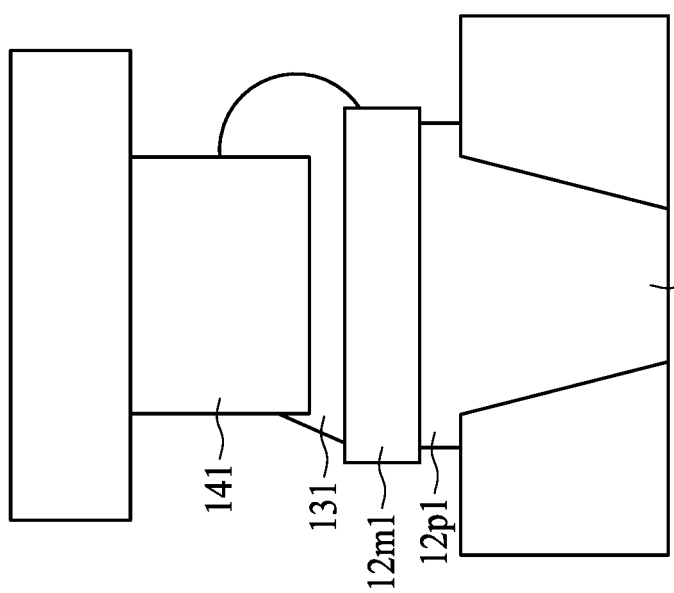
FIG. 2A illustrates an enlarged view of a portion in a dotted circle C1 as shown in FIG. 1B in accordance with some embodiments of the subject application.

FIG. 2A illustrates an enlarged view of a portion in a dotted circle C1 as shown in FIG. 1B in accordance with some embodiments of the subject application.

Referring to FIG. 2A, the connection element 131 with an asymmetrical structure is formed between the layer 12m1 and the conductive structure 141.

The connection element 131 has an asymmetrical shape. One side of the connection element 131 has a relatively greater volume. The connection element 131 has a greater volume at a side which is relatively close or adjacent to the alignment structure 163. The connection element 131 has a greater volume at a side which is relatively close or adjacent to the side s10 (shown in FIG. 1B) of the alignment structure 163. The connection element 131 has a greater volume at a side which is relatively close or adjacent to a side s10 adjacent to the side of the alignment structure 163. The connection element 131 has a greater volume at a side which is relatively close or adjacent to a corner of the alignment structure 163. The connection element 131 has a greater volume at a side which is relatively close or adjacent to a corner of the alignment structure 163, and the corner is an intersection of two sides of the alignment structure 163.

The conductive structure 141 may a conductive pillar or a conductive pad.

FIG. 2B illustrates an enlarged view of a structure which may replace the structure as shown in FIG. 2A in accordance with some embodiments of the subject application.

Referring to FIG. 2B, a conductive structure 14b and a conductive structure 12b are illustrated.

The conductive structure 12b is disposed on the conductive via 12v1 (not shown in FIG. 2B). The conductive structure 14b is disposed under the semiconductor device 153 (not shown in FIG. 2B). The conductive structure 12b is in direct contact with the conductive structure 14b. The conductive structure 12b may include, for example but not limited to, copper, gold or other suitable materials. The conductive structure 14b may include, for example but not limited to, copper, gold or other suitable materials. That is, the semiconductor device 153 is electrically connected to the conductive via through a metal to metal interface.

Figure 2G:
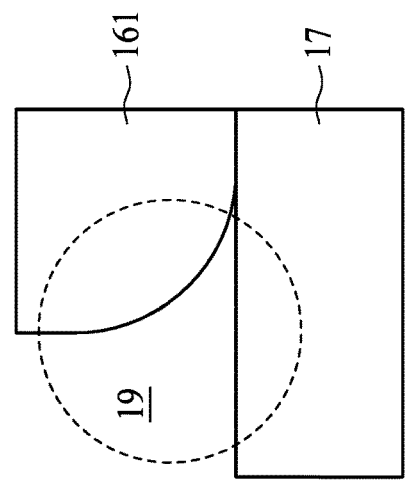
FIG. 2G illustrates an enlarged view of a portion in a dotted circle C4 as shown in FIG. 1B in accordance with some embodiments of the subject application.
Figure 2D:
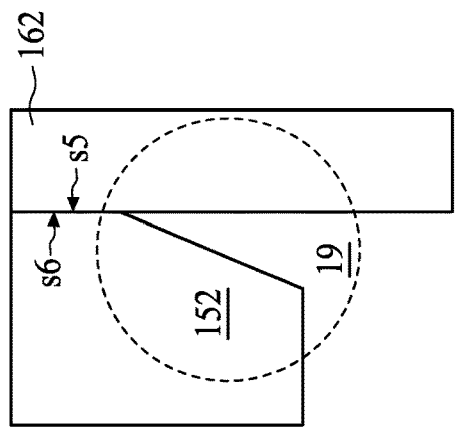
FIG. 2D illustrates an enlarged view of a portion in a dotted circle C3 as shown in FIG. 1B in accordance with some embodiments of the subject application.
Figure 2F:
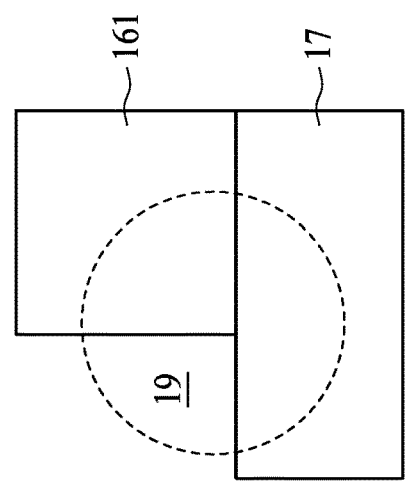
FIG. 2F illustrates an enlarged view of a portion in a dotted circle C4 as shown in FIG. 1B in accordance with some embodiments of the subject application.
Figure 2C:
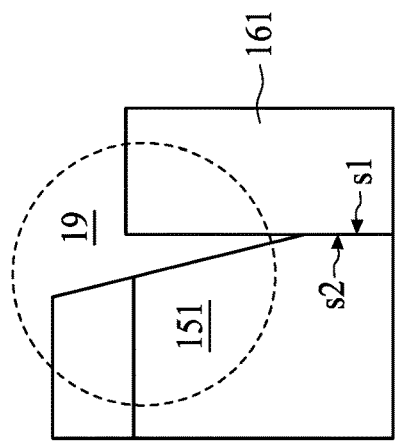
FIG. 2C illustrates an enlarged view of a portion in a dotted circle C2 as shown in FIG. 1B in accordance with some embodiments of the subject application.

FIG. 2C illustrates an enlarged view of a portion in a dotted circle C2 shown in FIG. 1B in accordance with some embodiments of the subject application.

Referring to FIG. 2C, the semiconductor device 151 is in contact with the alignment structure 161. The side s2 of the semiconductor device 151 is in contact with the side s1 of the alignment structure 161. A portion of the side s2 of the semiconductor device 151 is in contact with a portion of the side s1 of the alignment structure 161. The encapsulant 19 is between the semiconductor device 151 and the alignment structure 161. The encapsulant 19 is between the side s2 of the semiconductor device 151 and the side s1 of the alignment structure 161. The encapsulant 19 extends between the side s2 of the semiconductor device 151 and the side s1 of the alignment structure 161.

FIG. 2D illustrates an enlarged view of a portion in a dotted circle C3 shown in FIG. 1B in accordance with some embodiments of the subject application.

Referring to FIG. 2D, the semiconductor device 152 is in contact with the alignment structure 162. The side s6 of the semiconductor device 152 is in contact with the side s5 of the alignment structure 162. A portion of the side s6 of the semiconductor device 152 is in contact with a portion of the side s5 of the alignment structure 162. The encapsulant 19 is between the semiconductor device 152 and the alignment structure 162. The encapsulant 19 is between the side s6 of the semiconductor device 152 and the side s5 of the alignment structure 162. The encapsulant 19 extends between the side s6 of the semiconductor device 152 and the side s5 of the alignment structure 162.

Figure 2E:
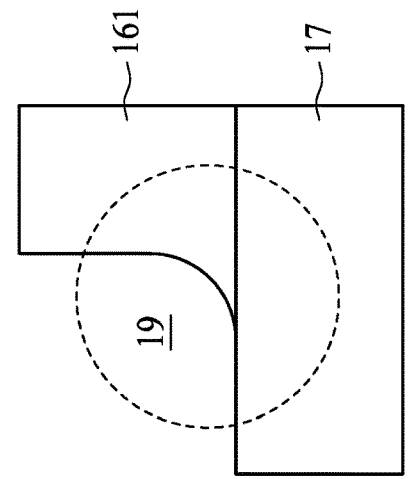
FIG. 2E illustrates an enlarged view of a portion in a dotted circle C4 as shown in FIG. 1B in accordance with some embodiments of the subject application.

FIG. 2E illustrates an enlarged view of a portion in a dotted circle C4 shown in FIG. 1B in accordance with some embodiments of the subject application.

Referring to FIG. 2E, the alignment structure 161 is disposed on the encapsulant 17. The alignment structure 161 is in contact with the encapsulant 19. The bottom portion of the alignment structure 161 (not denoted in FIG. 2E) extends toward the encapsulant 19 (e.g., outward).

FIG. 2F illustrates an enlarged view of a portion in a dotted circle C4 shown in FIG. 1B in accordance with some embodiments of the subject application.

Referring to FIG. 2F, the alignment structure 161 is disposed on the encapsulant 17. The alignment structure 161 is in contact with the encapsulant 19. The bottom portion of the alignment structure 161 (not denoted in FIG. 2F) is substantially vertical to the encapsulant 17.

FIG. 2G illustrates an enlarged view of a portion in a dotted circle C4 shown in FIG. 1B in accordance with some embodiments of the subject application.

Referring to FIG. 2G, the alignment structure 161 is disposed on the encapsulant 17. The alignment structure 161 is in contact with the encapsulant 19. The bottom portion of the alignment structure 161 (not denoted in FIG. 2G) extends toward the alignment structure 161 (e.g., inward).

FIG. 3A, FIG. 3B, FIG. 3C, FIG. 3D, FIG. 3E, FIG. 3F, FIG. 3G and FIG. 3H illustrate operations of manufacturing a substrate 30 in accordance with some embodiments of the subject application.

Figure 3A:
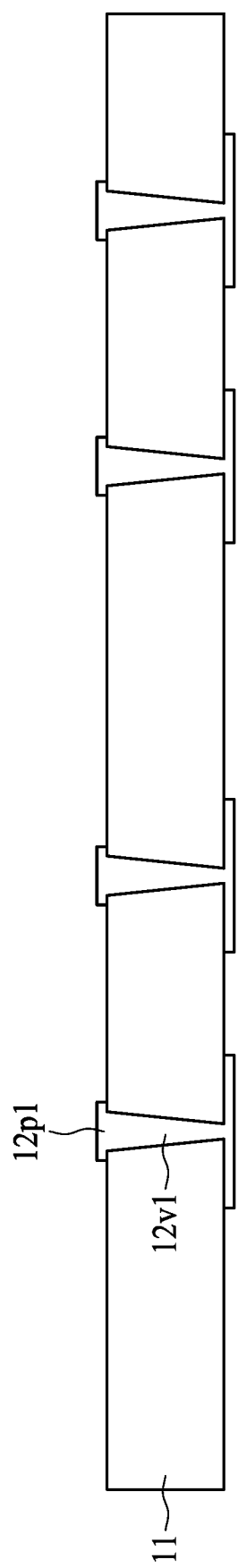
FIG. 3A, FIG. 3B, FIG. 3C, FIG. 3D, FIG. 3E, FIG. 3F, FIG. 3G and FIG. 3H illustrate operations of manufacturing a substrate in accordance with some embodiments of the subject application.

Referring to FIG. 3A, a substrate 11 is provided. The substrate 11 has conductive vias 12v1. Conductive structures 12p1 are disposed on the conductive vias 12v1.

The conductive vias 12v1 may be filled with conductive material, for example but not limited to, copper or other suitable materials. The conductive structures 12p1 may be, for example but not limited to, a conductive pad.

Figure 3B:
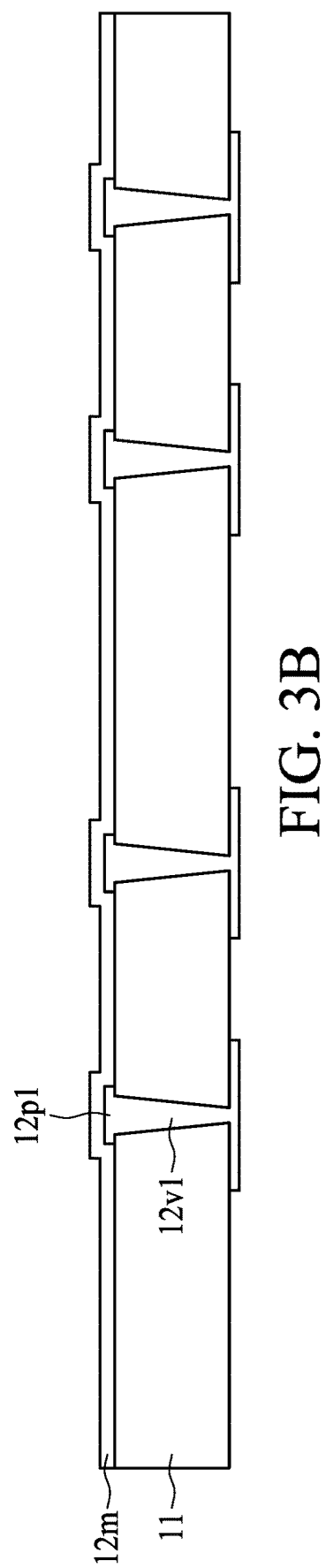

Referring to FIG. 3B, a layer is formed on the substrate 11. The layer 12m covers the substrate 11. The layer 12m covers the conductive structures 12p1. The layer 12m may be, for example but not limited to, a metal film. The layer 12m may be formed by, for example but not limited to, a physical vapor deposition (PVD) operation or a plating operation.

Figure 3C:
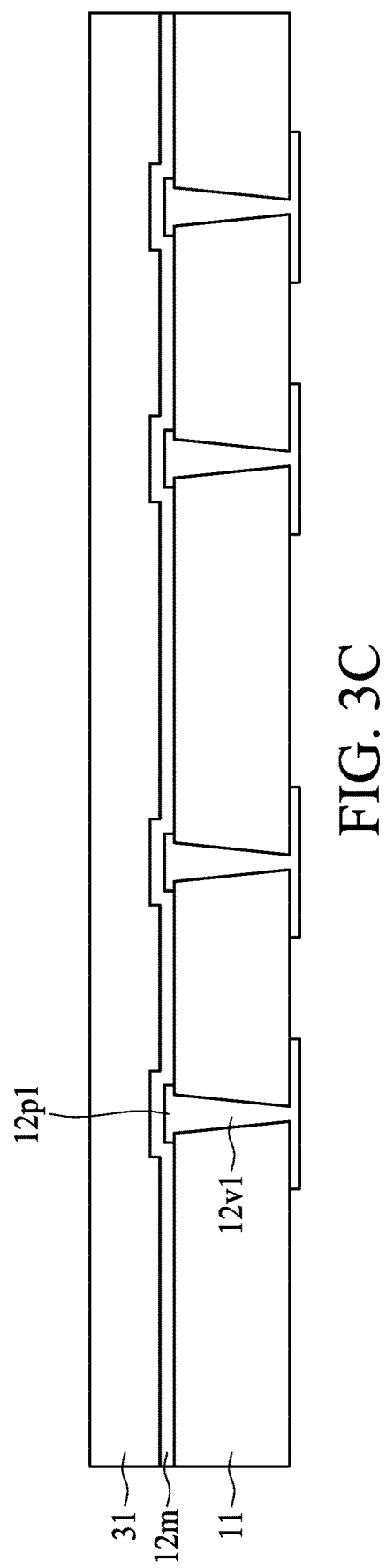

Referring to FIG. 3C, a photo-sensitive material (e.g., a PR material) 31 is formed on the layer 12m. The photo-sensitive material 31 may be formed by, for example but not limited to, a coating, printing, or screening process. A lithography operation is performed to expose the photo-sensitive material 31.

Figure 3D:
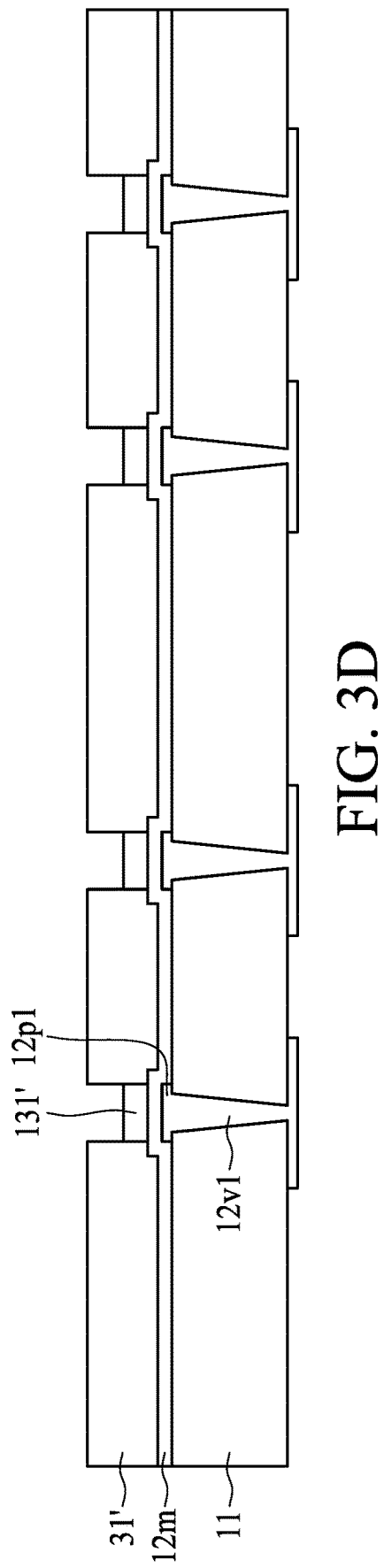

Referring to FIG. 3D, the photo-sensitive material 31' is developed. A portion of the photo-sensitive material 31 is removed and the photo-sensitive material 31' is formed. A portion of the photo-sensitive material 31 may be removed by, for example but not limited to, an etching operation. A portion of the layer 12m is exposed. A connection element 131' is formed on the layer 12m. The connection element 131' is formed within the photo-sensitive material 31'. The connection element 131' may include gold (Au), silver (Ag), aluminum (Al), copper (Cu), or an alloy thereof. The connection element 131' may be formed by, for example but not limited to, a plating operation.

Figure 3E:
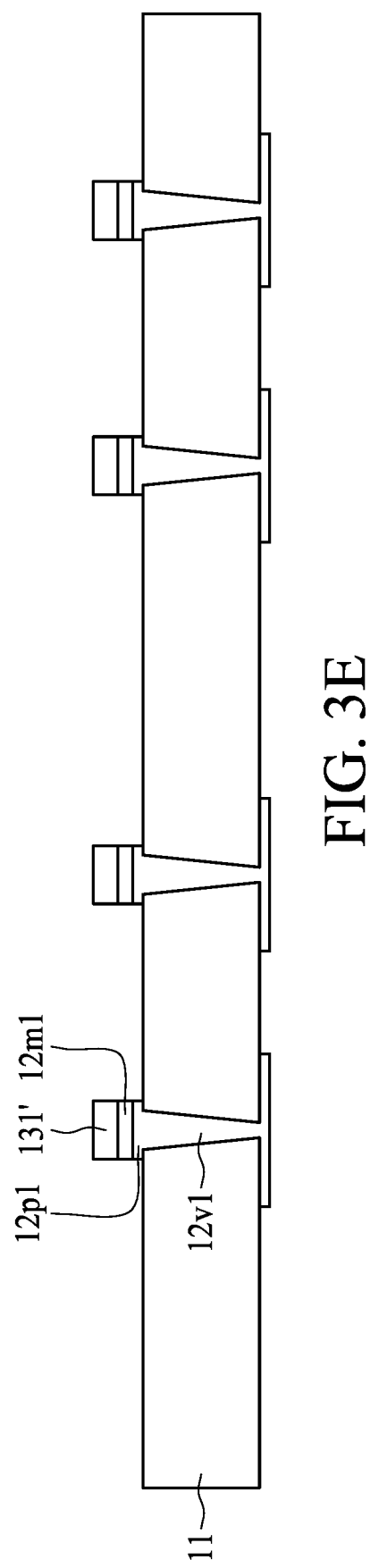

Referring to FIG. 3E, the photo-sensitive material 31' is removed. A portion of the layer 12m is removed. A portion of the layer 12m covered by the photo-sensitive material 31' is removed. A portion of the layer 12m is removed by, for example but not limited to, an etching operation. The layer 12m1 is formed on the conductive structure 12p1. The layer 12m1 is formed under the connection element 131'.

Figure 3F:
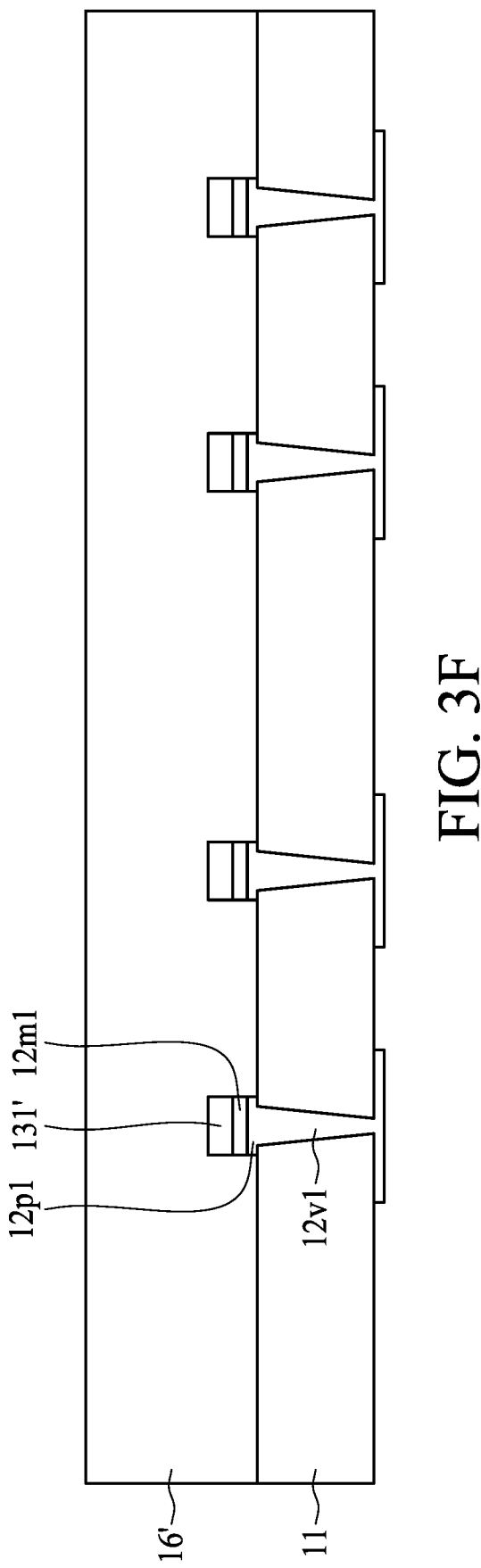

Referring to FIG. 3F, a photo-sensitive material (e.g., a PR material) 16' is formed on the substrate 11. The photo-sensitive material 16' covers the substrate 11. The photo-sensitive material 16' covers the connection element 131'. The photo-sensitive material 16' may be formed by, for example but not limited to, a coating, printing, or screening process. A lithography operation is performed to expose the photo-sensitive material 16'.

Figure 3G:
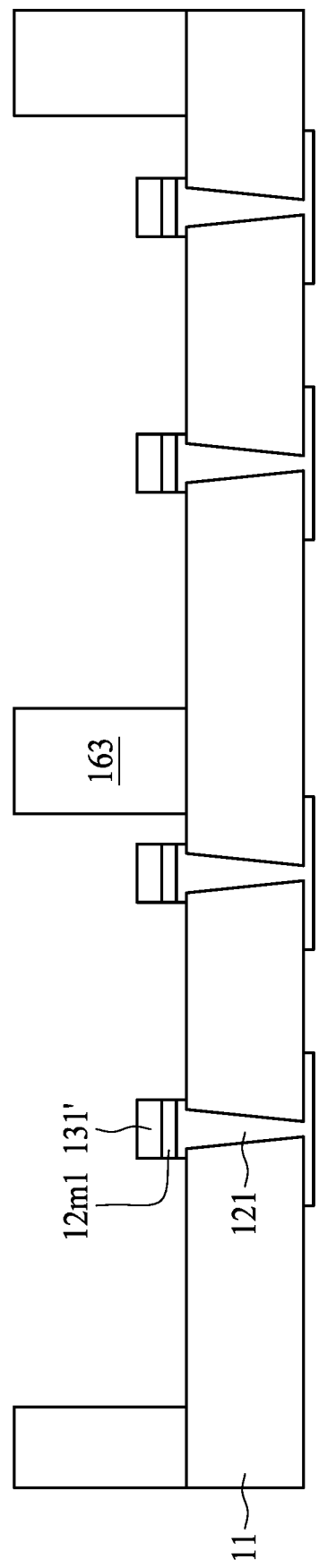

Referring to FIG. 3G, a portion of the photo-sensitive material 16' is removed. A portion of the photo-sensitive material 16' may be removed by, for example but not limited to, an etching operation. Alignment structures 163 are formed on the substrate.

Figure 3H:
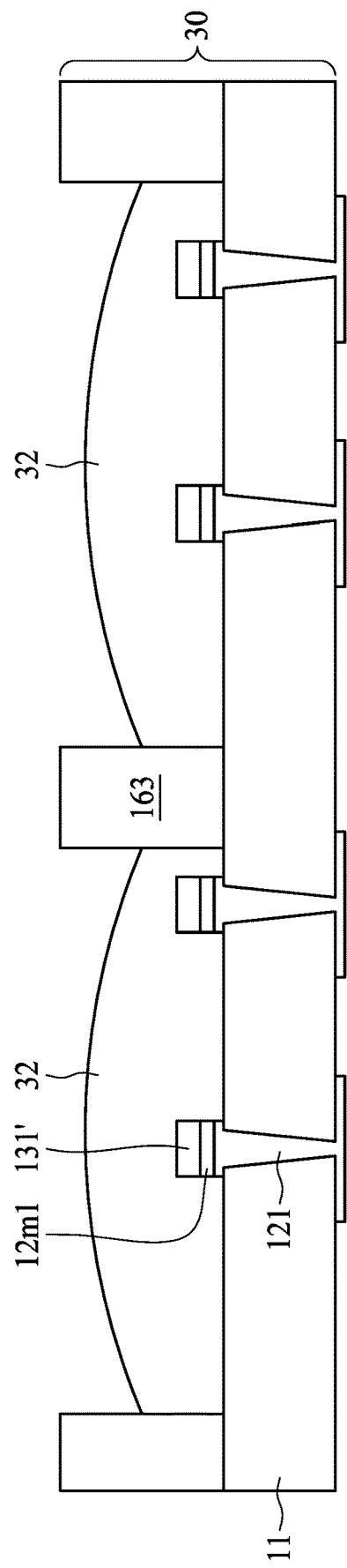

Referring to FIG. 3H, a fluid 32 is arranged on the substrate 11 to form a structure 30. The fluid 32 is poured within a space enclosed by the alignment structure 163. The amount of the fluid 32 may be determined or predetermined based on the height or thickness of each alignment structure 163. The fluid 32 has a relatively greater density than the semiconductor device to be disposed in the alignment structure 163. The fluid 32 may include, for example but not limited to, a formic acid solution, an iodine solution, a bromine solution, a chlorine solution, a tungsten boric acid solution or other suitable materials.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N and FIG. 4O illustrate operations of manufacturing a semiconductor device package 1a in accordance with some embodiments of the subject application.

Figure 4A:
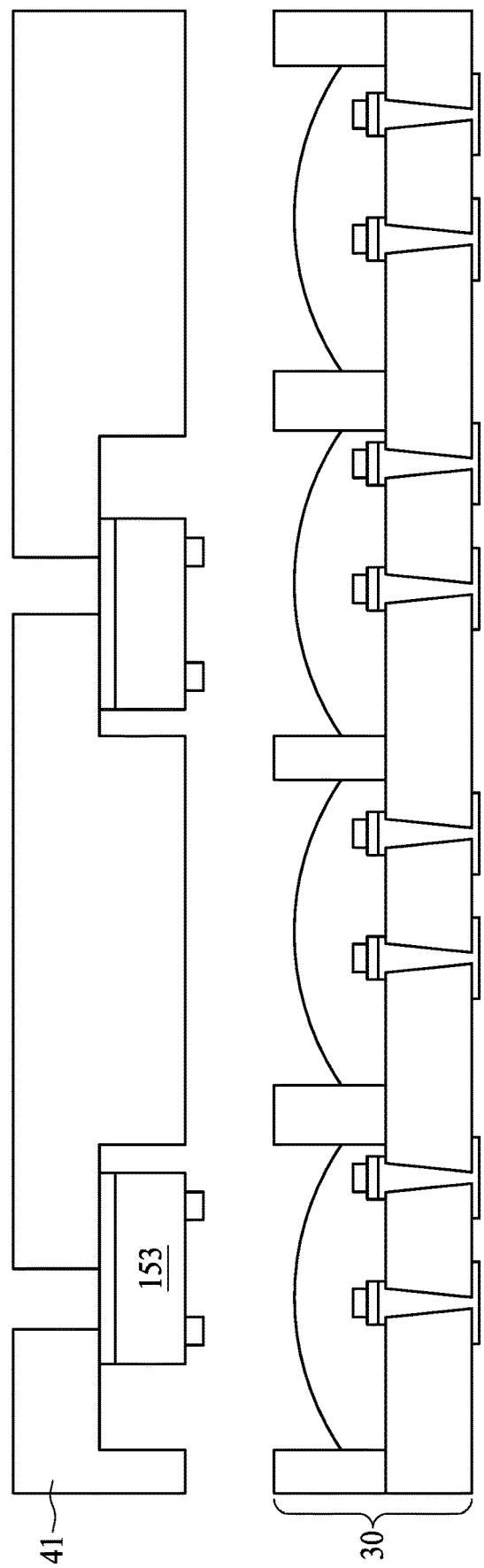
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N and FIG. 4O illustrate operations of manufacturing a semiconductor device package in accordance with some embodiments of the subject application.

Referring to FIG. 4A, a structure 30 as shown in FIG. 3H is provided. The structure 30 may be manufactured by the operations illustrated and described with reference to FIG. 3A, FIG. 3B, FIG. 3C, FIG. 3D, FIG. 3E, FIG. 3F, FIG. 3G and FIG. 3H. A placing tool 41 is arranged above the substrate 11. The placing tool 41 holds the semiconductor devices 153. The placing tool 41 holds the semiconductor devices 153 through, for example but not limited to, vacuum suction. The placing tool 41 may be, for example but not limited to, a vacuum nozzle or the like.

Figure 4B:
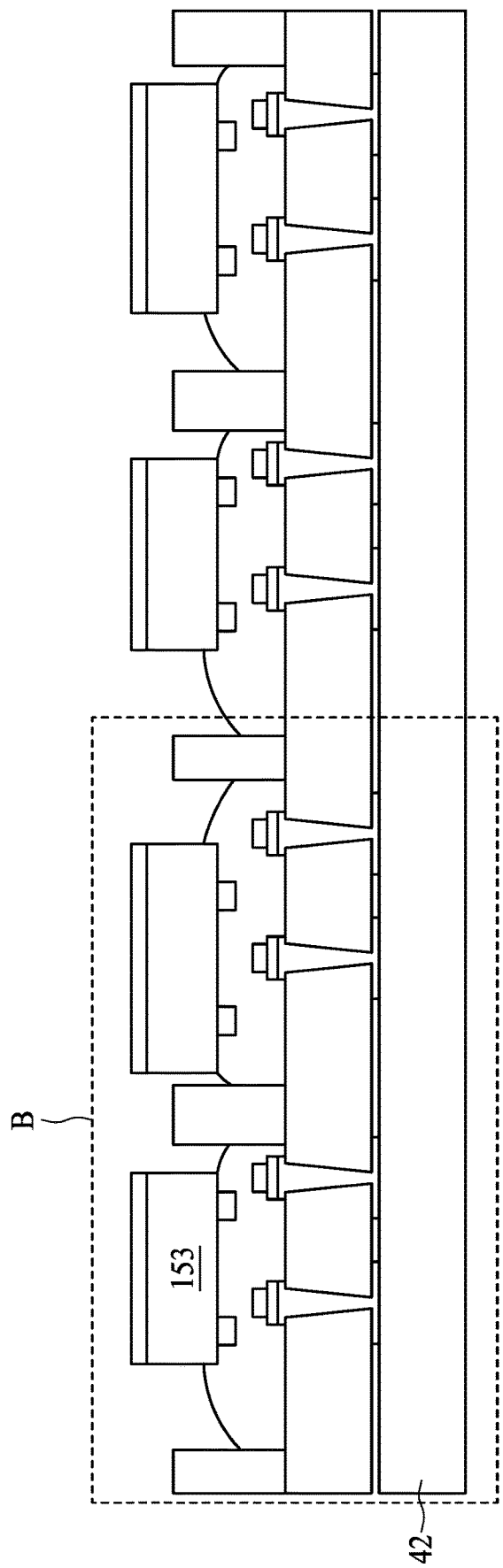

Referring to FIG. 4B, the semiconductor device 153 is disposed on the fluid 32. The semiconductor device 153 is adrift or afloat on the fluid 32. The substrate 11 is placed on a carrier 42. Each of some of the semiconductor devices 153 is placed within the alignment structures 163 at a time. Each of some of the semiconductor devices 153 may be placed on the substrate 11 by pick-and-place technique in accordance with some other embodiments of the subject application.

The fluid 32 has a density greater than a density of the semiconductor device 153.

For simplicity, the structure in a dotted box B is selectively illustrated in the subsequent operations.

Figure 4C:
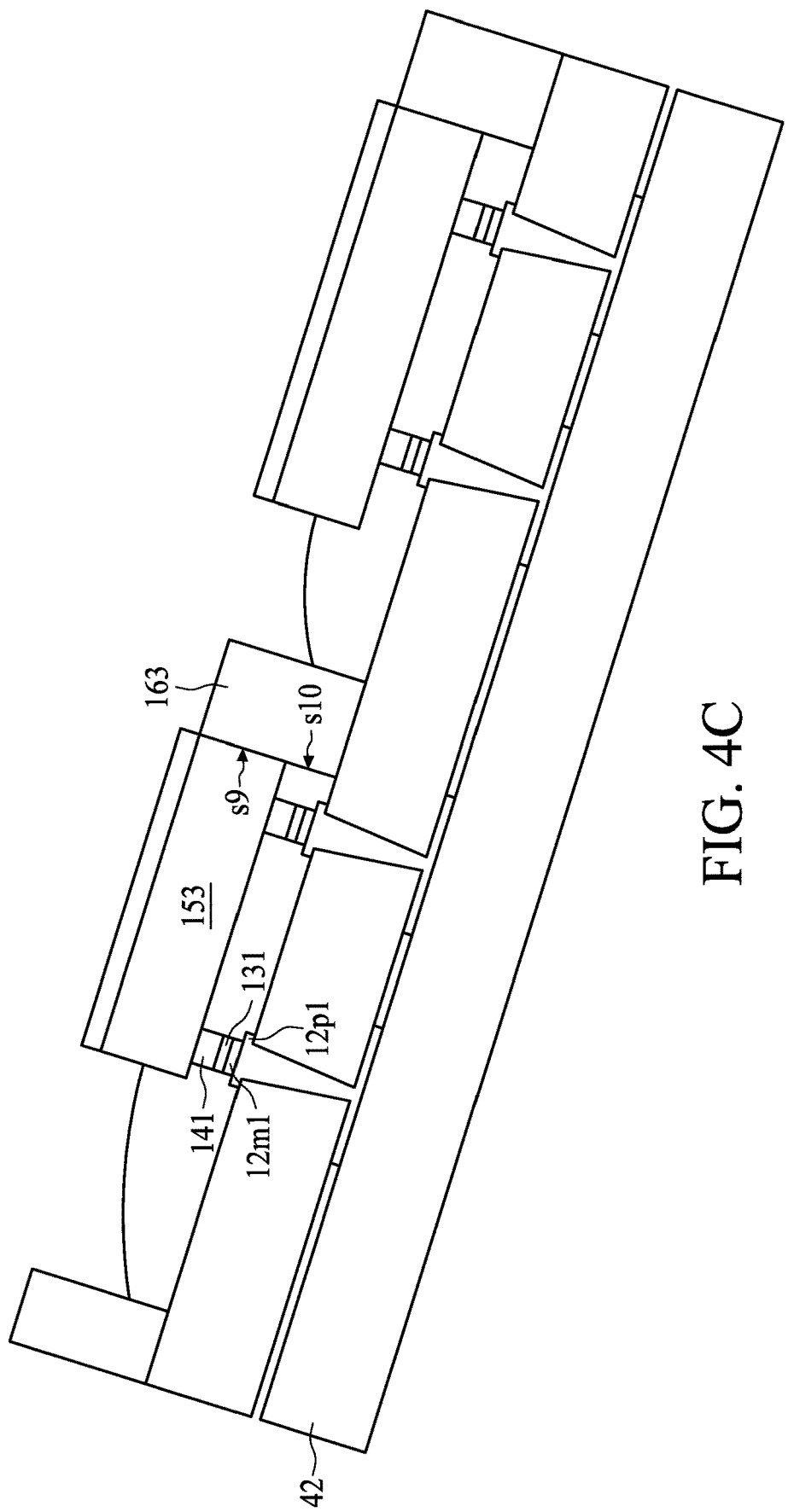

Referring to FIG. 4C, the structure as shown in FIG. 4B is tilted. A side of the carrier 42 may be lifted such that the semiconductor device 153, which is adrift or afloat on the fluid 32, floats or drifts or moves to abut against the alignment structure 163 due to gravity. The semiconductor device 153 is in direct contact with the alignment structure 163. The semiconductor device 153 is stopped by the alignment structure 163. The conductive structure 141 is aligned with the connection element 131'. The conductive structure 141 is aligned with the conductive structure 12$p$1. The semiconductor device 153 is in direct contact with the alignment structure 163. The side s9 of the semiconductor device 153 is in direct contact with the side s10 of the alignment structure 163.

The alignment structure 163, which may be manufactured by lithography technique and has a relatively less deviation or tolerance, may help to precisely bond the semiconductor device 153 to the substrate 10. In other word, misalignment between the conductive structure 141 and the connection element 131' is alleviated or minimized. For example, misalignment between the conductive structure 141 and the connection element 131' can be controlled to be less than 2 um. For example, misalignment between the conductive structure 141 and the connection element 131' can be controlled to be less than 1 um.

An ultrasonic wave may be applied to remove or eliminate bubbles in the fluid 32. The ultrasonic wave may help to align or calibrate the semiconductor device 153 and the alignment structure 163.

Figure 4D:
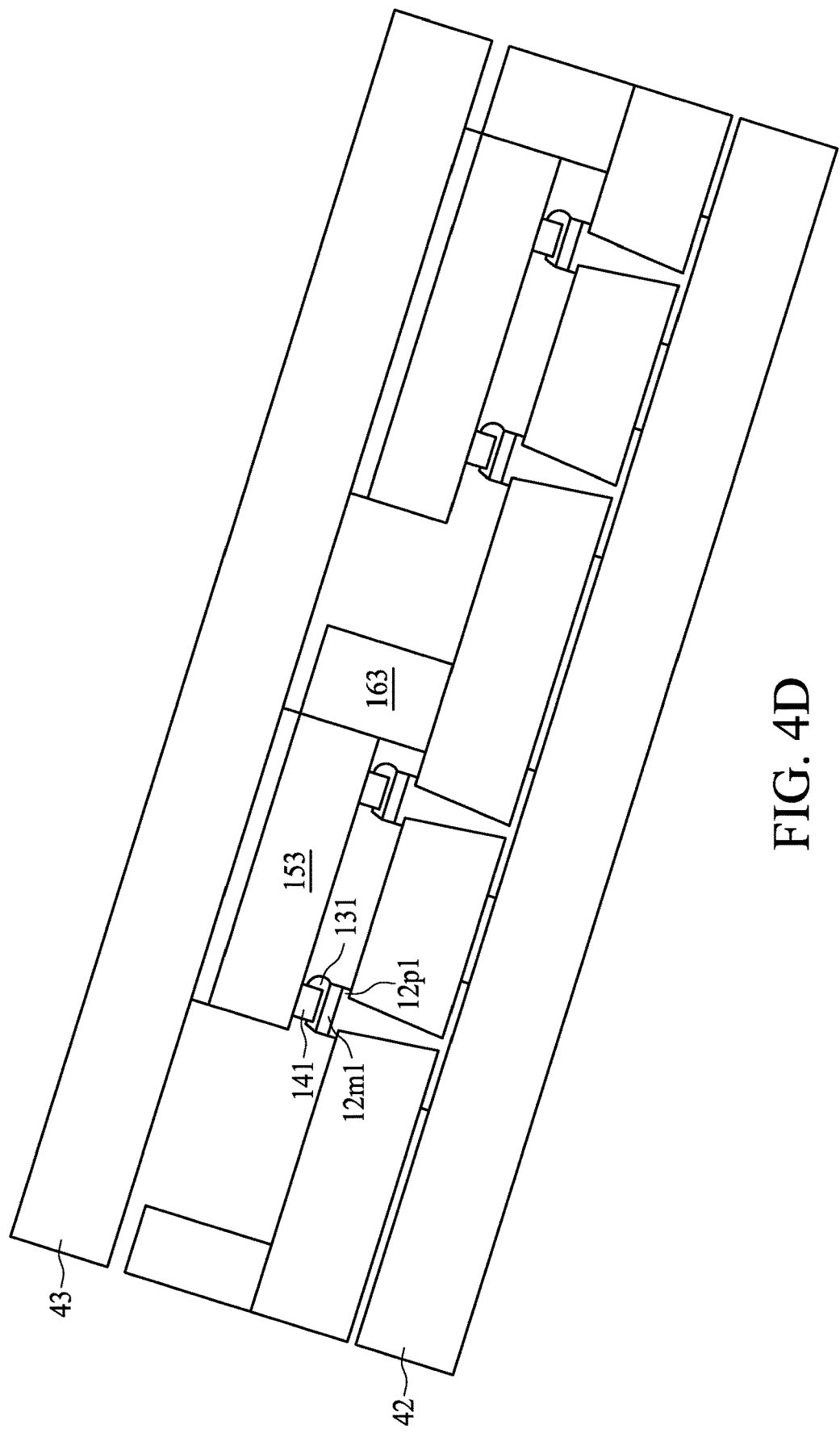

Referring to FIG. 4D, the fluid 32 is removed. The fluid 32 may be removed by, for example but not limited to, a chemical cleaning technique.

A presser 43 is arranged on the semiconductor device 153. The presser may perform, for example, a press operation. A force is applied from the presser 43 to the semiconductor device 153. A heating operation may be carried out on the substrate 11 to form the connection elements 131. The semiconductor device 153 is bonded to the substrate 11. The conductive structure 141 is bonded to the conductive structure 12$p$1. During the heating operation, the connection element 131 may be melted and may flow toward the alignment structure 163 due to gravity.

The connection element 131 has an asymmetrical shape. One side of the connection element 131 has a relatively greater volume. The connection element 131 has a greater volume at a side which is relatively close or adjacent to the alignment structure 163. The connection element 131 has a greater volume at a side which is relatively close or adjacent to the side s10 of the alignment structure 163. The connection element 131 has a greater volume at a side which is relatively close or adjacent to a side (not denoted in FIG. 4D) adjacent to the side s10 of the alignment structure 163. The connection element 131 has a greater volume at a side which is relatively close or adjacent to a corner (not denoted in FIG. 4D) of the alignment structure 163. The connection element 131 has a greater volume at a side which is relatively close or adjacent to a corner of the alignment structure 163, and the corner is an intersection of two sides of the alignment structure 163.

Figure 4E:
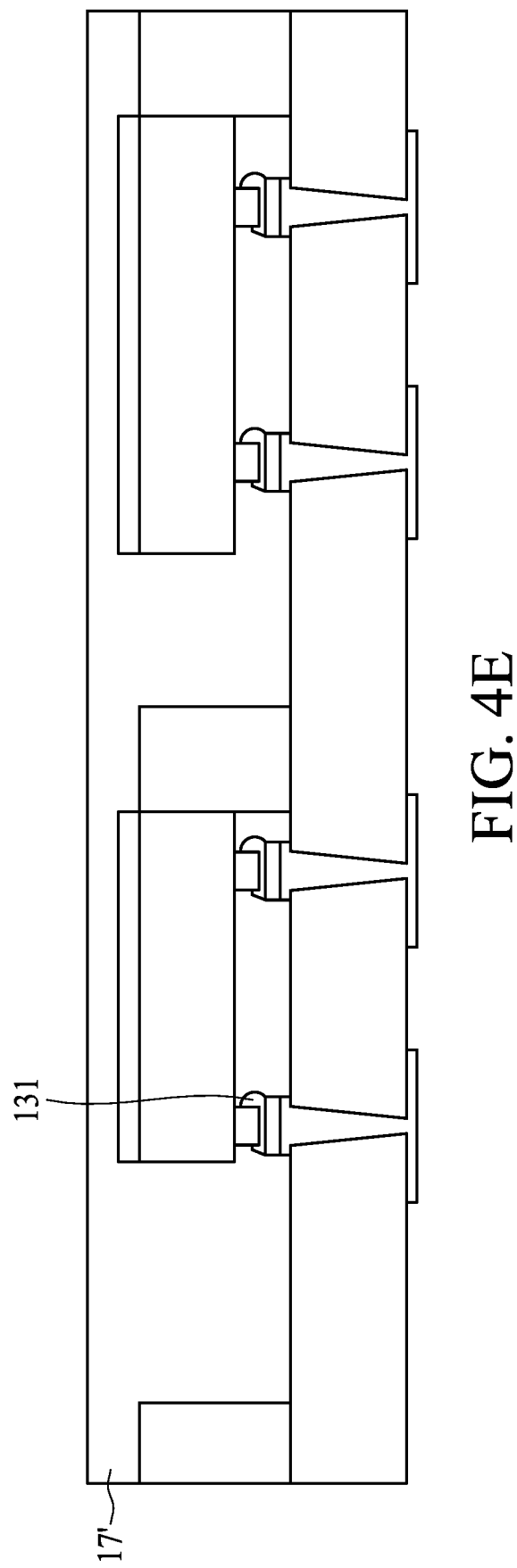

Referring to FIG. 4E, the carrier 42 is horizontally arranged and the structure as shown in FIG. 4D is no longer tilted or lifted. The carrier 42 and the presser 43 are removed. An encapsulant 17' is formed on the substrate 11 to encapsulate the semiconductor device 153 and the alignment structure 163. The encapsulant 17' covers the substrate 11. The encapsulant 17' may include epoxy. The encapsulant 17' may include fillers or particles.

Figure 4F:
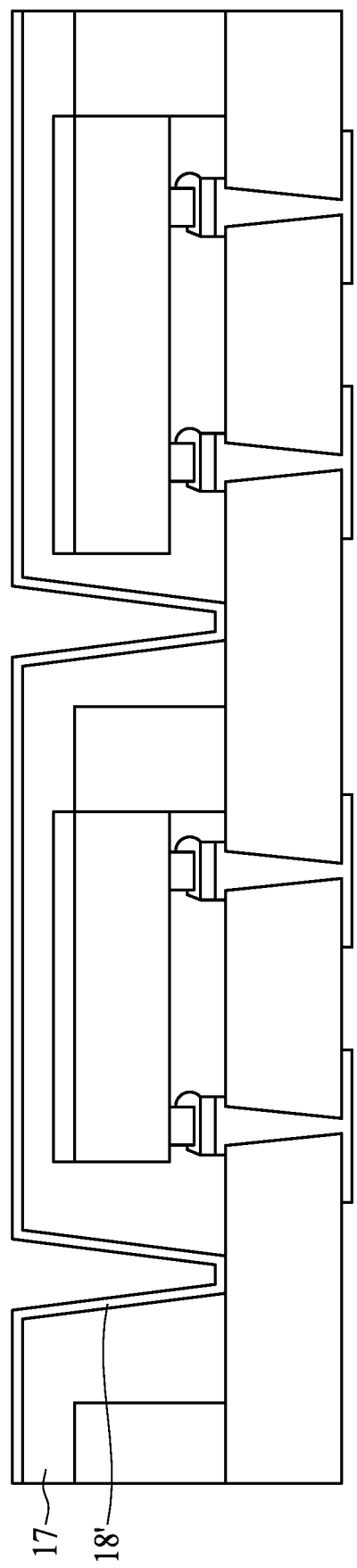

Referring to FIG. 4F, a portion of the encapsulant 17' is removed. The encapsulant 17' may be removed by, for example but not limited to, an etching operation. The encapsulant 17 is formed. A layer 18' is formed on the encapsulant 17. The layer 18' may include, for example but not limited to, a metal film or other suitable materials. The layer 18' may be formed by, for example but not limited to, a PVD operation or a plating operation.

Figure 4G:
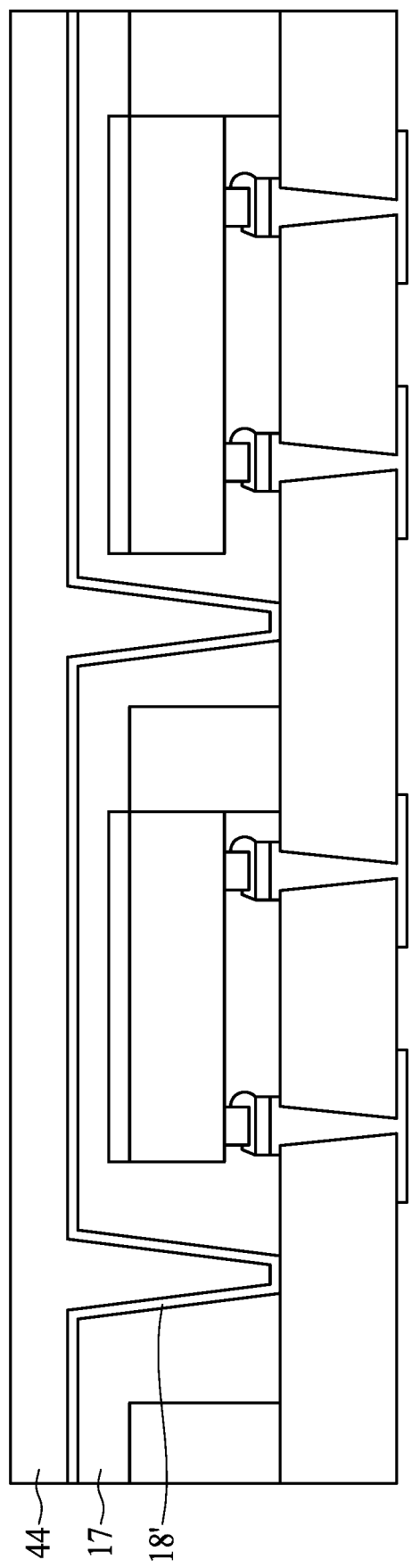

Referring to FIG. 4G, a photo-sensitive material 44 is formed on the layer 18'. The photo-sensitive material 44 may be formed by, for example, a coating, printing, or screening process. A lithography operation is performed to expose the photo-sensitive material 44.

Figure 4H:
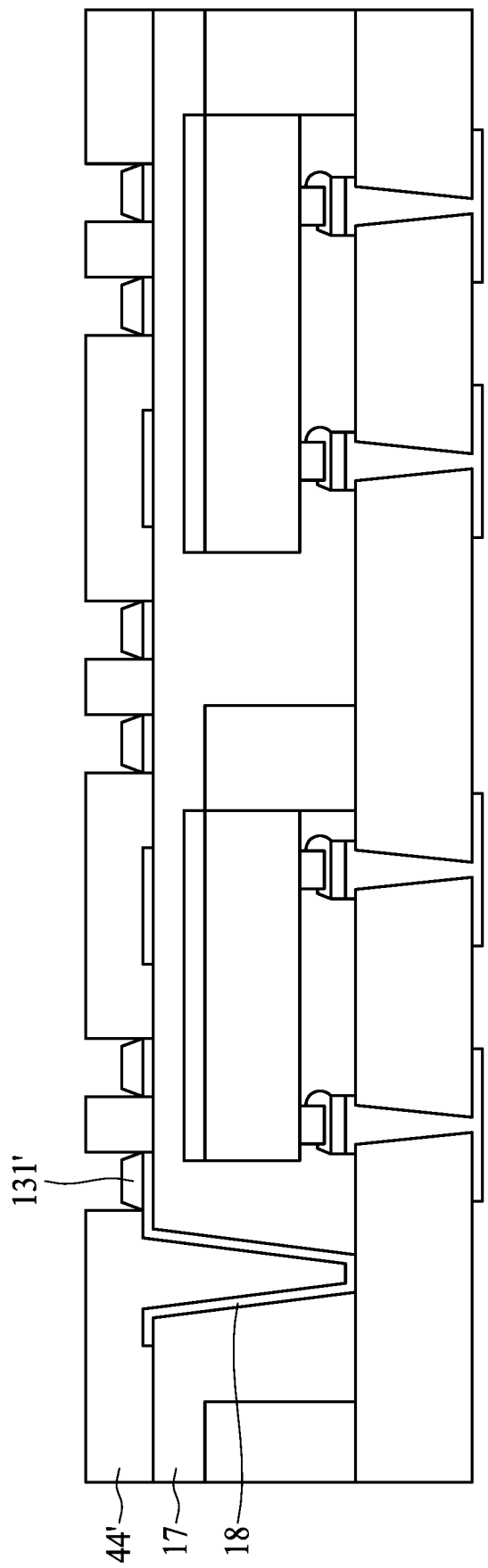

Referring to FIG. 4H, the photo-sensitive material 44' is developed. A portion of the photo-sensitive material 44 is removed and the photo-sensitive material 44' is formed. A portion of the photo-sensitive material 44 may be removed by, for example, an etching operation. A portion of the layer 18' is exposed. A connection element 131' is formed on the layer 18'. The connection element 131' is formed within the photo-sensitive material 44'. The connection element 131' may include gold (Au), silver (Ag), aluminum (Al), copper (Cu), or an alloy thereof. The connection element 131' may be formed by, for example but not limited to, a plating operation.

Figure 4I:
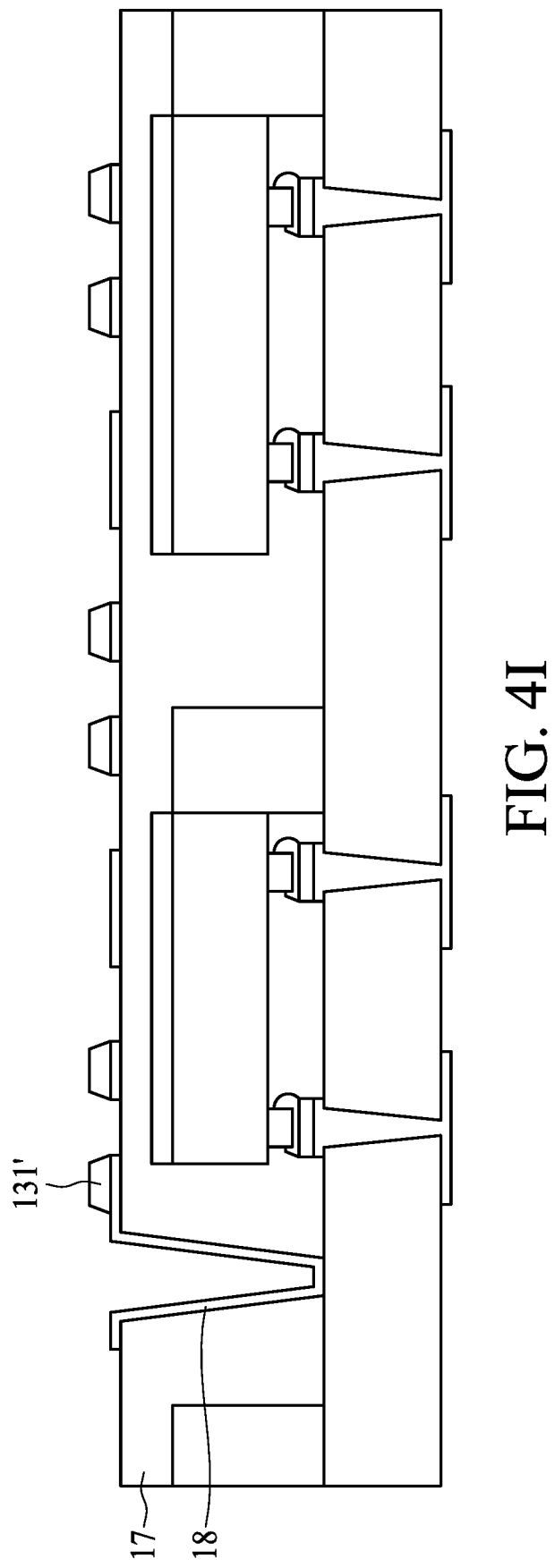

Referring to FIG. 4I, the photo-sensitive material 44' is removed. The photo-sensitive material 44' may be removed by, for example but not limited to, an etching operation. A portion of the layer 18' is removed. The 18' may be removed by, for example but not limited to, an etching operation. A layer 18 is formed. The layer 18 may be patterned to provide electrical connections on the encapsulant 17.

Figure 4J:
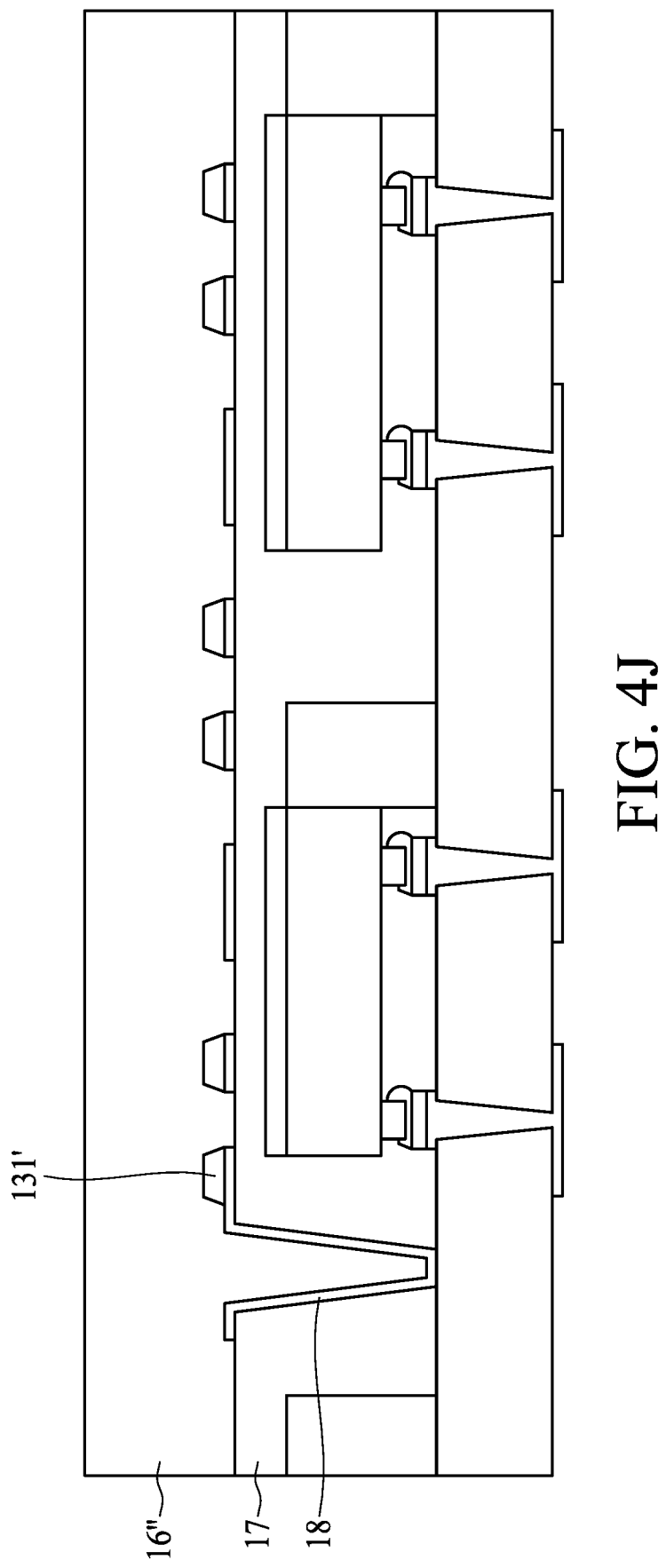

Referring to FIG. 4J, a photo-sensitive material (e.g., a PR material) 16" is formed on the encapsulant 17. The photo-sensitive material 16" covers the encapsulant 17. The photo-sensitive material 16" covers the layer 18. The photo-sensitive material 16" may be formed by, for example but not limited to, a coating, printing, or screening process. A lithography operation is performed to expose the photo-sensitive material 16".

Figure 4K:
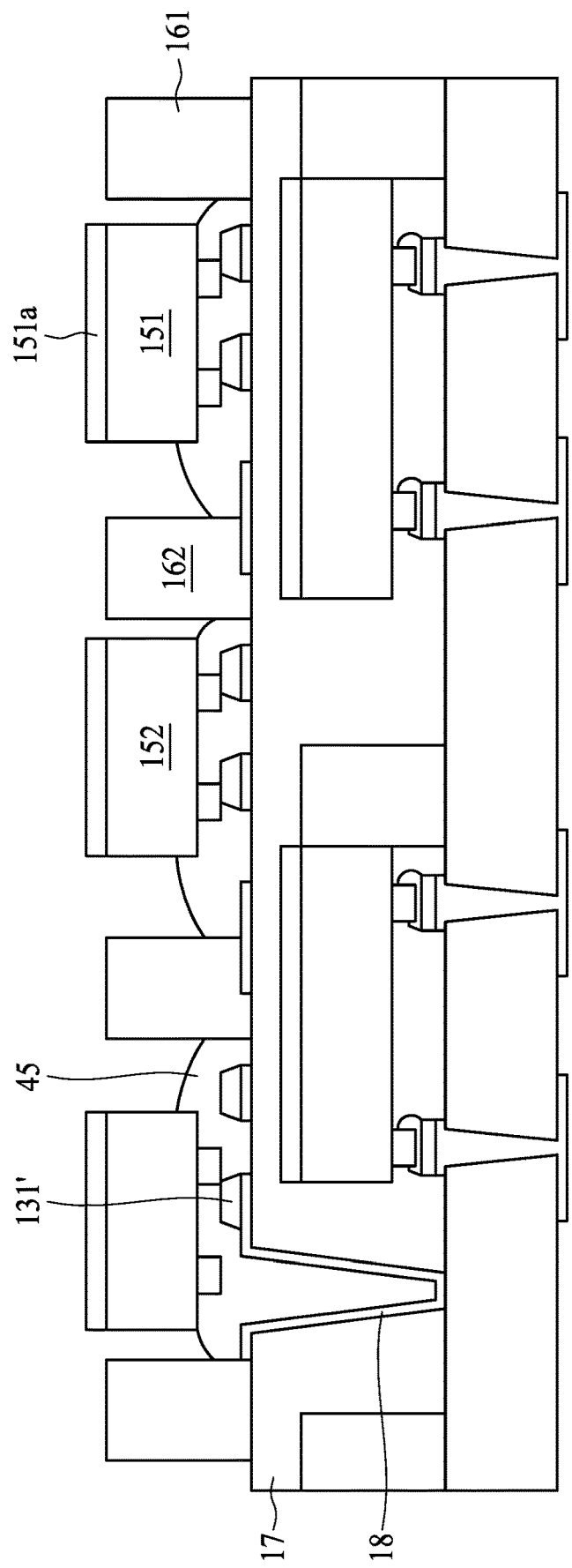

Referring to FIG. 4K, a portion of the photo-sensitive material 16" is removed. A portion of the photo-sensitive material 16" may be removed by, for example and not limited to, an etching operation. An alignment structure 161 is formed on the substrate. An alignment structure 162 is formed on the substrate.

A fluid 45 may be arranged on the encapsulant 17. In some embodiments, the fluid 45 may be the same as the fluid 32 illustrated and described with reference to FIG. 3H. In some embodiments, the fluid 45 may be different from the fluid 32 illustrated and described with reference to FIG. 3H.

Semiconductor devices 151 and 152 are placed on the fluid 45. The fluid 45 has a density greater than a density of the semiconductor device 151. The fluid 45 has a density greater than a density of the semiconductor device 152. In some embodiments, the semiconductor device 151 is adrift or afloat on the fluid 45. In some embodiments, the semiconductor device 152 is adrift or afloat on the fluid 45. In some embodiments, each of some of the semiconductor devices 151 or 152 is placed within the alignment structures 161 or 162 at a time. Each of some of the semiconductor devices 151 or 152 may be placed on the fluid 45 by pick-and-place technique in accordance with some other embodiments of the subject application.

Figure 4L:
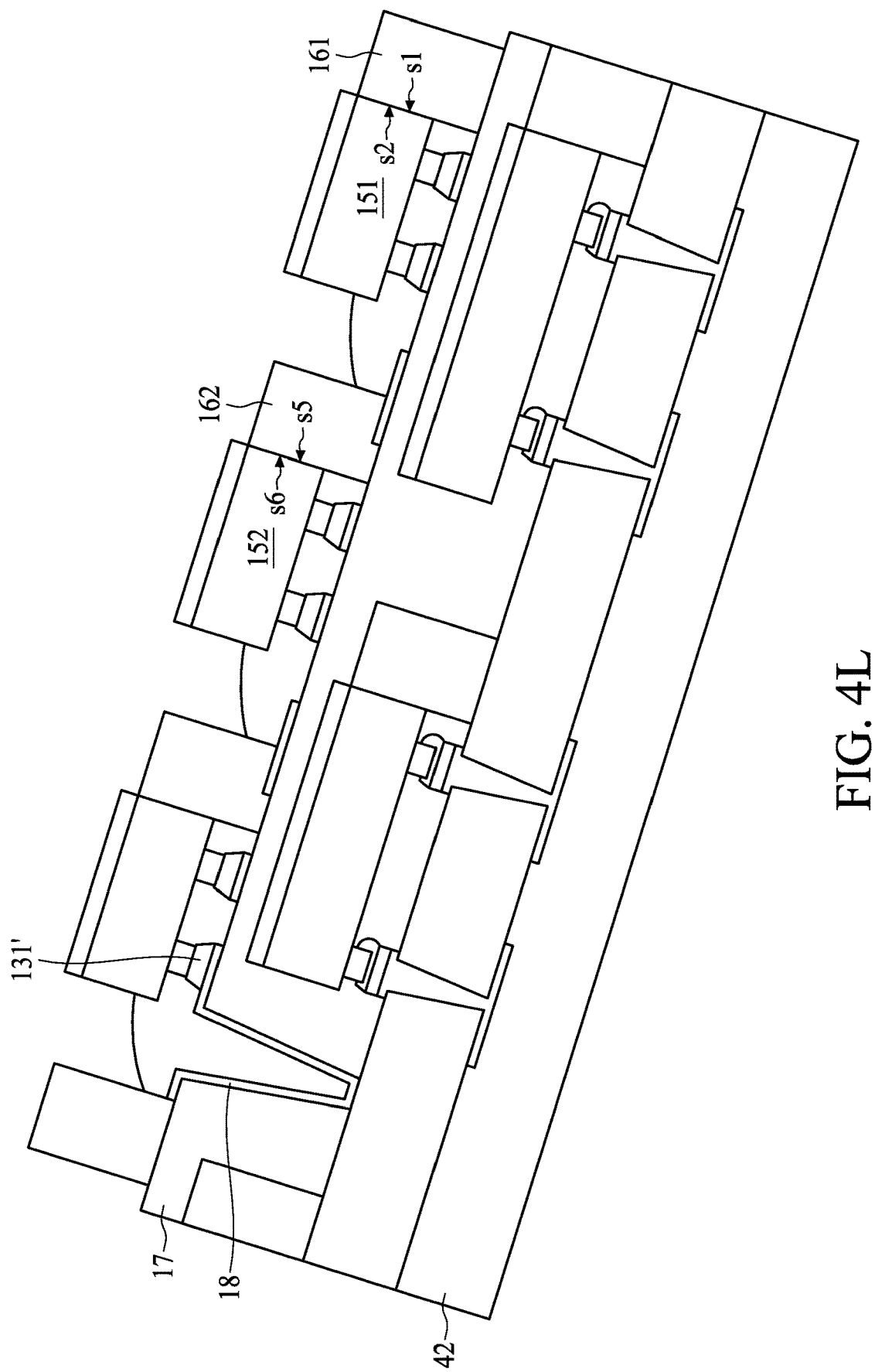

Referring to FIG. 4L, the substrate 11 is placed on the carrier 42. The substrate 11 is tilted by the carrier 42. A side of the carrier 42 may be lifted such that the semiconductor device 151 or 152, which is adrift or afloat on the fluid 45, floats or drifts or moves to abut against the alignment structure 161 or 162 due to gravity.

The semiconductor device 151 is in direct contact with the alignment structure 161. The side s2 of the semiconductor device 151 is in direct contact with the side s1 of the alignment structure 161. The semiconductor device 152 is in direct contact with the alignment structure 162. The side s6 of the semiconductor device 152 is in direct contact with the side s5 of the alignment structure 162.

The alignment structure 161 or 162, which may be manufactured by lithography technique and has a relatively less deviation or tolerance, may help to precisely bond the semiconductor device 151 or 152 to the substrate 10. In other word, misalignment between the conductive structure (not denoted in FIG. 4L) and the connection element (FIG. 4L) is alleviated or minimized. For example, misalignment between the conductive structure and the connection element can be controlled to be less than 2 um. For example, misalignment between the conductive structure and the connection element can be controlled to be less than 1 um.

Figure 4M:
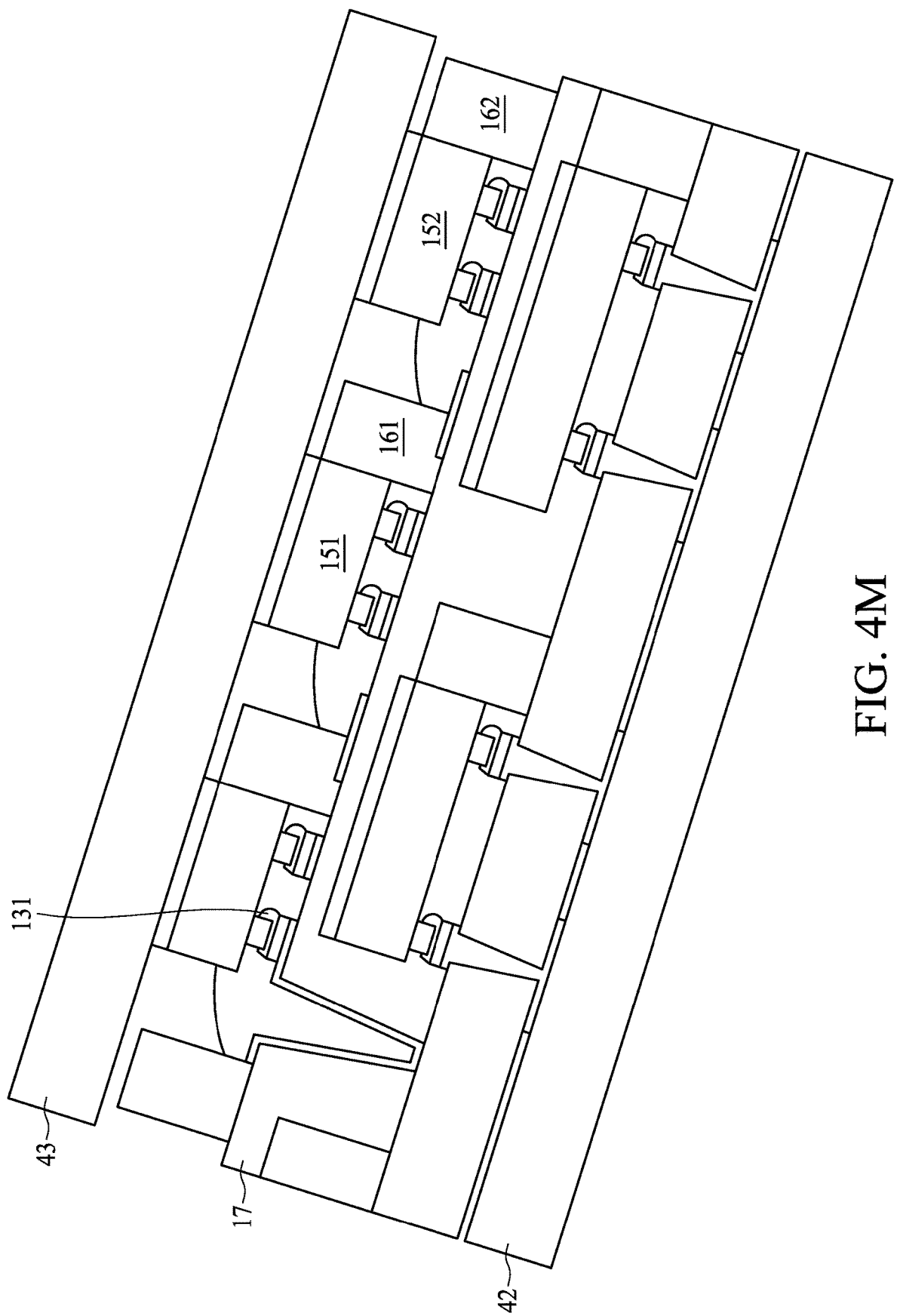

Referring to FIG. 4M, the presser 43 is arranged on the semiconductor device 151 and 152. An external force is applied from the presser 43 to the semiconductor device 151 and 152. A heating operation may be carried out on the substrate 11. Connection elements 131 are formed. The connection element 131 between the semiconductor device 151 and the encapsulant 17 is formed. The connection element 131 between the semiconductor device 152 and the encapsulant 17 is formed. During the heating operation, the connection element 131 may be melted and may flow toward the alignment structure 161 or 162 due to gravity.

The connection element 131 has an asymmetrical shape. One side of the connection element 131 has a relatively greater volume. The connection element 131 has a greater volume at a side which is relatively close or adjacent to the alignment structure 163. The connection element 131 has a greater volume at a side which is relatively close or adjacent to the side of the alignment structure 161 or 162. The connection element 131 has a greater volume at a side which is relatively close or adjacent to a corner (not denoted in FIG. 4M) of the alignment structure 161 or 162.

Figure 4N:
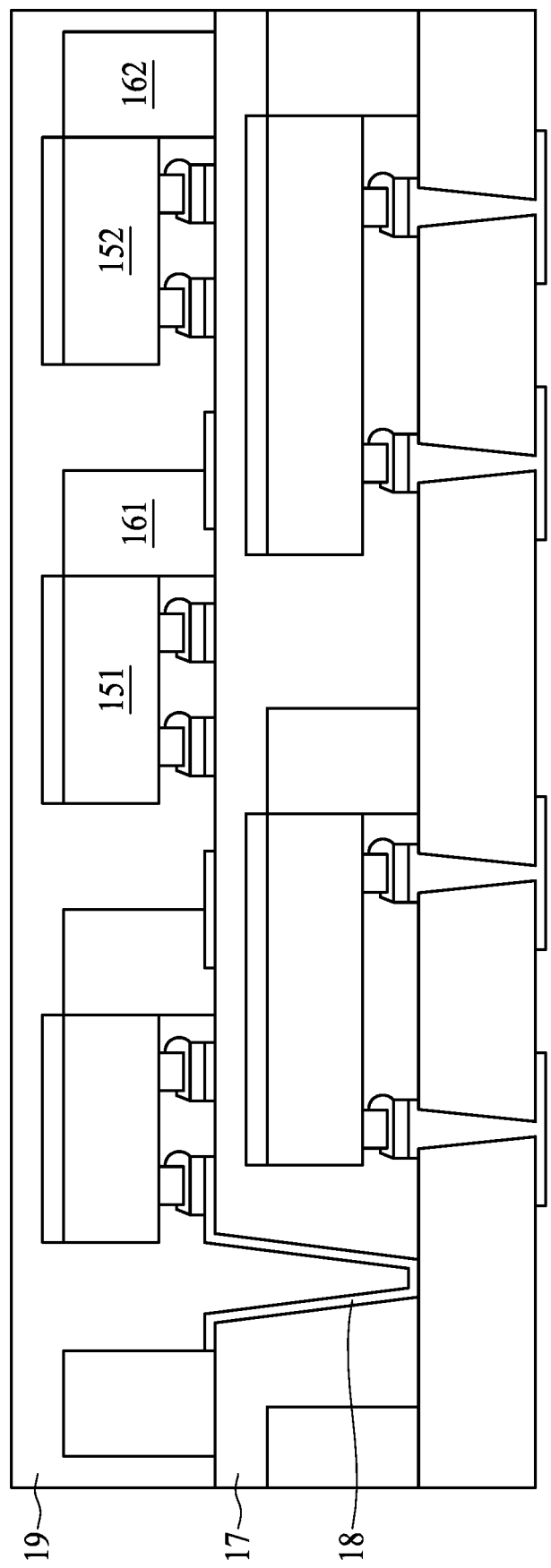

Referring to FIG. 4N, the carrier 42 is horizontally arranged and the structure as shown in FIG. 4M is no longer tilted or lifted. The carrier 42 and the presser 43 are removed. The substrate 11 is placed horizontally. An encapsulant 19 is formed on the substrate 11 to encapsulate the encapsulant 17, the semiconductor device 151, 152 and the alignment structure 161, 162. The encapsulant 19 may include epoxy. The encapsulant 19 may include fillers or particles.

Figure 4O:
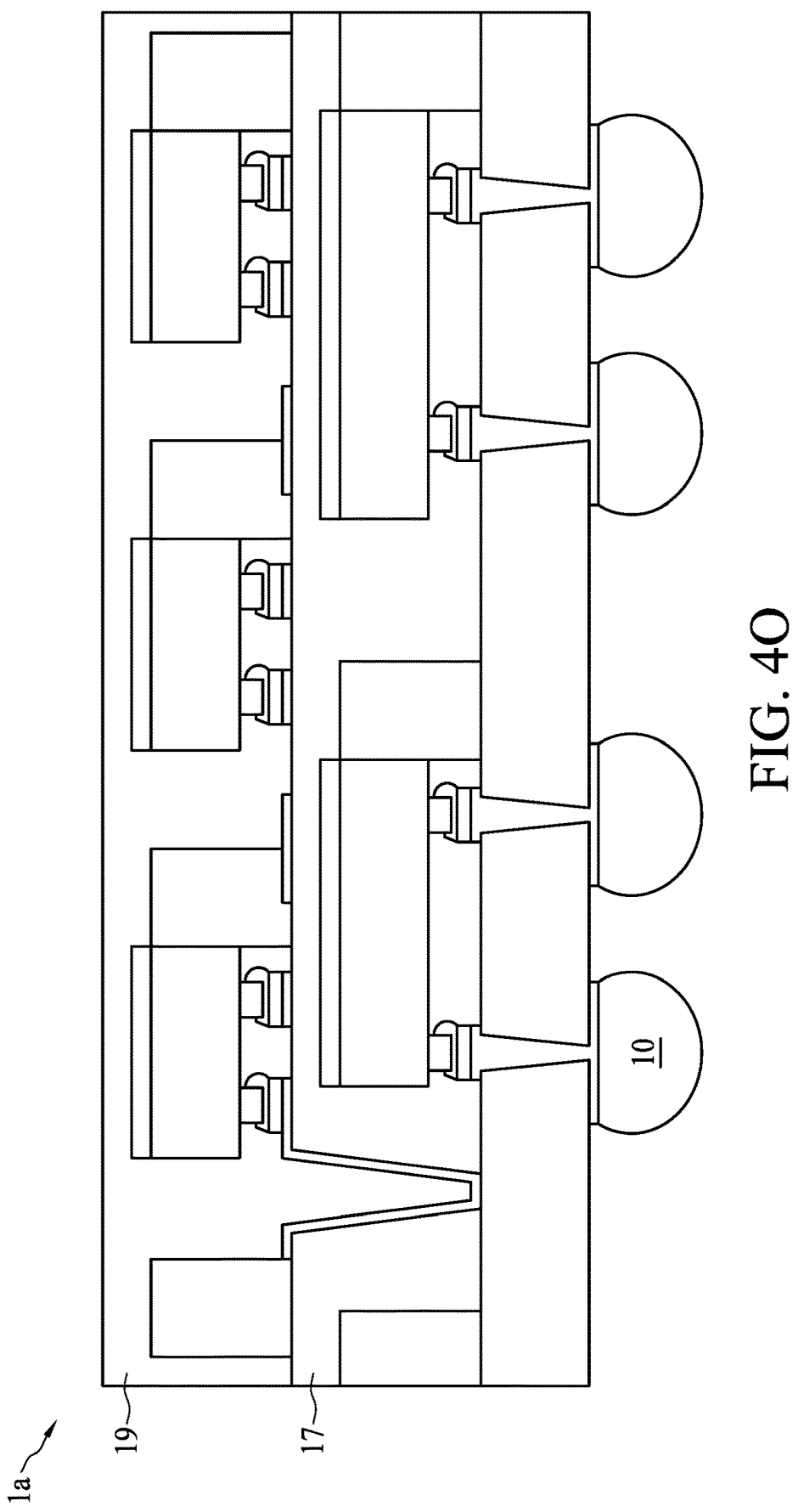

Referring to FIG. 4O, connection elements 10 are formed under the substrate 11. Forming the connection elements 10 may include, for example but not limited to, a reflow operation. The connection elements 10 may include, for example but not limited to, a solder material or other suitable materials.

Figure 5B:
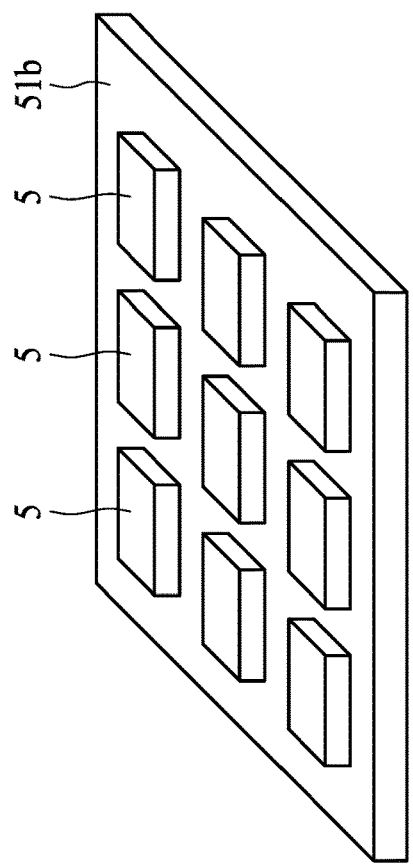
FIG. 5A and FIG. 5B illustrate various types of semiconductor device packages in accordance with some embodiments of the subject application.
Figure 5A:
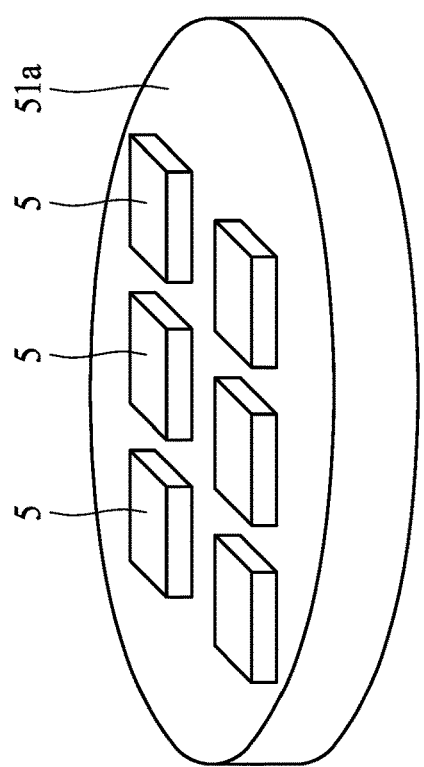

FIG. 5A and FIG. 5B illustrate various types of semiconductor device packages in accordance with some embodiments of the subject application. The semiconductor device packages may be bonded to each other or may be bonded to an external device.

Referring to FIG. 5A, a plurality of chips, dies or semiconductor device packages 5 are placed on a square-shaped carrier 51a. In some embodiments, the carrier 51a may include organic materials (e.g., molding compounds, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

Referring to FIG. 5B, a plurality of chips, dies or semiconductor device packages 5 are placed on a circle-shaped carrier 51b. In some embodiments, the carrier 51b may include organic materials (e.g., molding compounds, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

Figure 6A:
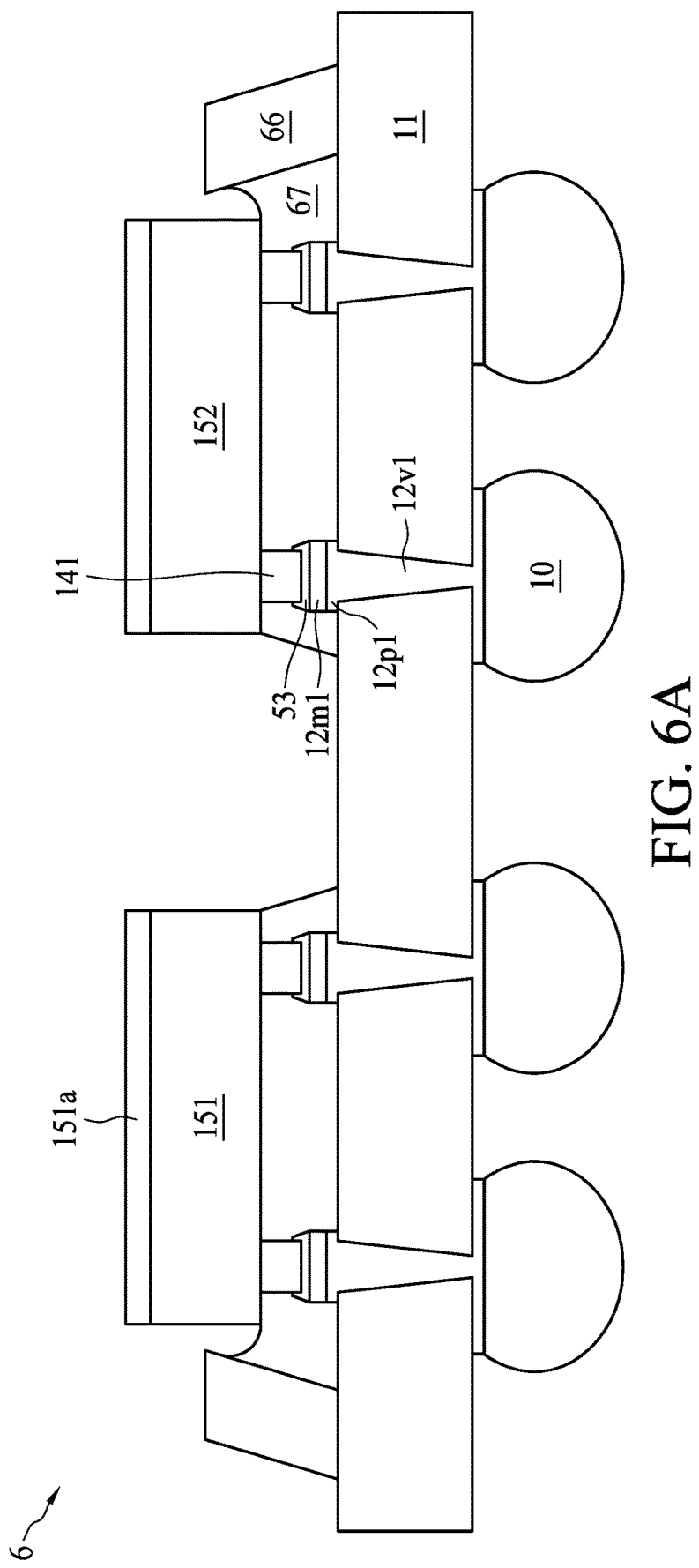
FIG. 6A illustrates a cross-sectional view of a semiconductor device package in accordance with some embodiments of the subject application.

FIG. 6A illustrates a cross-sectional view of a semiconductor device package 6 in accordance with some embodiments of the subject application.

Referring to FIG. 6A, the semiconductor device package 6 comprises connection elements 10 and 53, a substrate 11, conductive vias $12v1$, conductive structures $12p1$, 141, layers $12m1$, semiconductor devices 151, 152, dam bars 66 and encapsulants or underfills 67.

The semiconductor device 152 is disposed on the substrate 11. The semiconductor device 152 is electrically connected to the connection elements 10 through the conductive structure 141, the connection element 53, the layer $12m1$, the conductive structure $12p1$ and the conductive via $12v1$.

The dam bar 66 is disposed on the substrate 11. The dam bar 66 is not in contact with the semiconductor device 151 or the semiconductor device 152. The dam bar 66 is in direct contact with the encapsulant or the underfill 67.

Figure 6B:
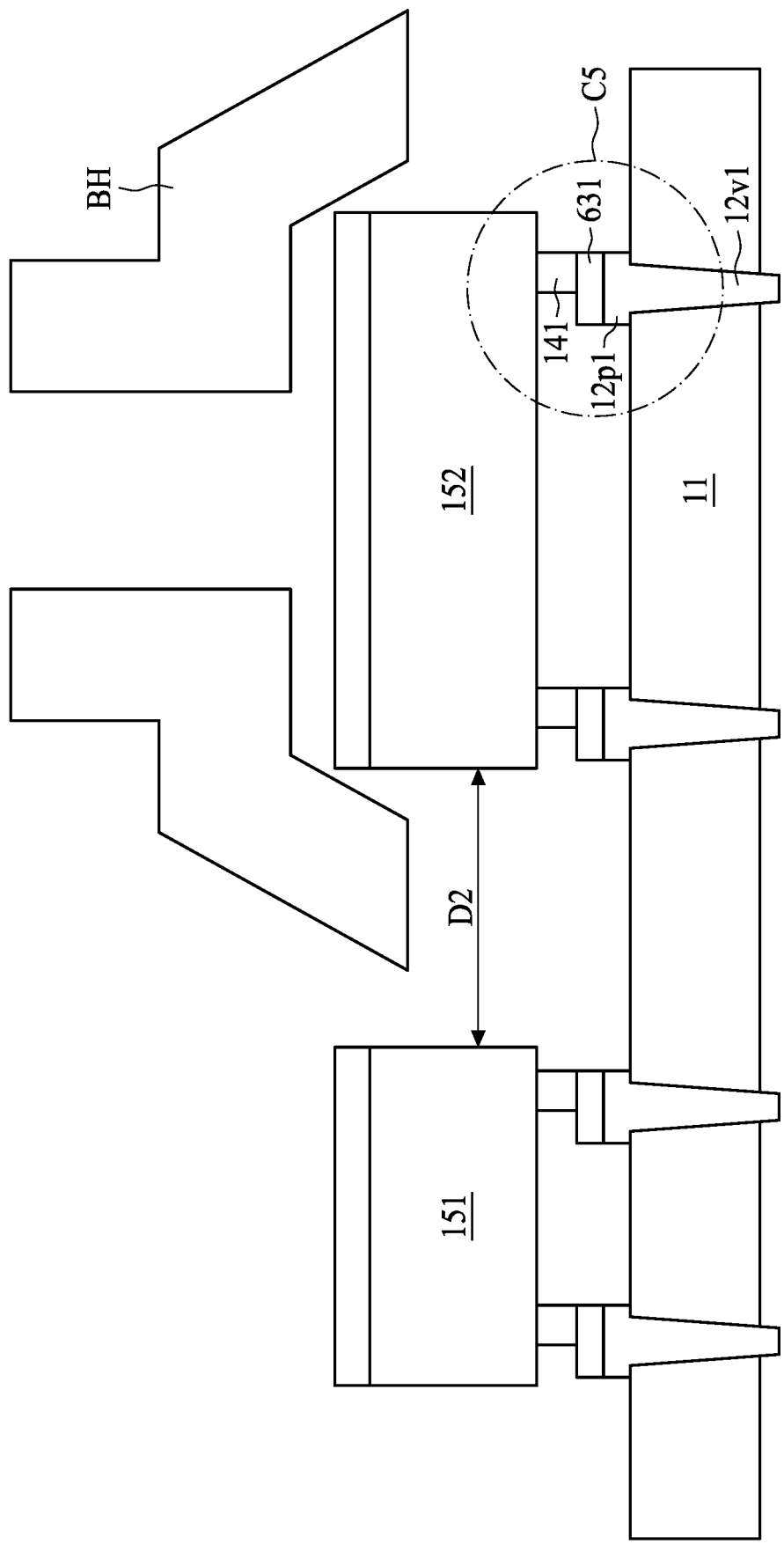
FIG. 6B illustrates an operation of placing semiconductor device in accordance with some embodiments of the subject application.

FIG. 6B illustrates an operation of forming the semiconductor device package 6 with reference to FIG. 6A.

Figure 6C:
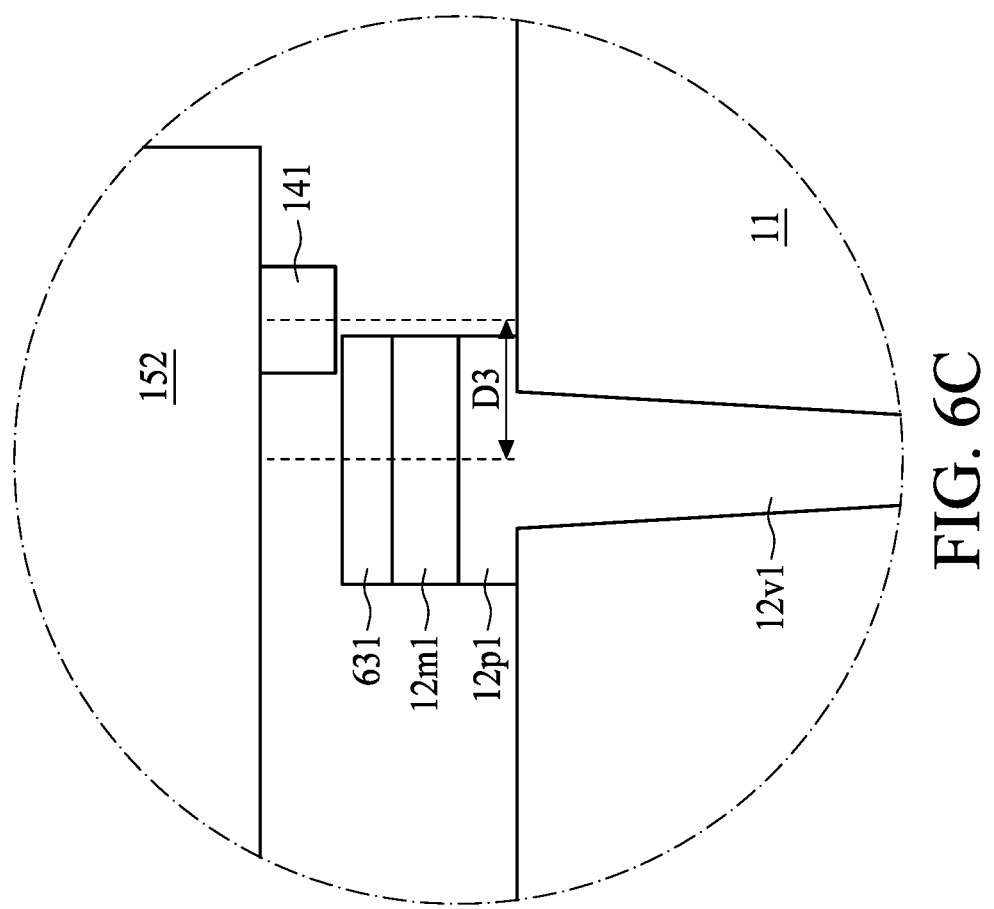
FIG. 6C illustrates an enlarged view of a portion in a dotted circle C5 as shown in FIG. 6B in accordance with some embodiments of the subject application.

Referring to FIG. 6A, a placing tool BH is placing the semiconductor device 152 on the substrate. The placing tool BH may be, for example but not limited to, a bonding head. The placing tool BH picks the semiconductor device 152 and places the semiconductor device 152 on the substrate 11 for bonding. A side portion (not denoted in FIG. 6B) of the placing tool BH extends between the semiconductor device 151 and the semiconductor device 152. A distance D2 represents the gap between the semiconductor device 151 and the semiconductor device 152. To avoid contact between the placing tool BH and the semiconductor device 151, the distance D2 should be greater than 2 mm. Minimization of gap the semiconductor device 151 and the semiconductor device 152 may be impinged or hindered by the size of the placing tool BH FIG. 6C illustrates an enlarged view of a portion in a dotted circle C5 shown in FIG. 6B in accordance with some embodiments of the subject application.

For better yield and signal quality, the conductive structure 141 should be aligned with the connection element 631 while the placing tool BH is placing the semiconductor device 152. A distance D3 represents the distance between an axis passing through the center of the conductive structure 141 and another axis passing through the center of the connection element 631. In other words, the distance D3 represents misalignment between the conductive structure 141 and the connection element 631, which is around 1-2 um. As a result, the semiconductor device package 6 with the semiconductor device 152 placed by the placing tool BH may have a relatively greater misalignment and poorer signal quality compared to the semiconductor device package 1a with the semiconductor device 151 placed by the placing tool 41 as illustrated and described with reference to FIG. 4A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a displacement of the surface relative to a flat plane between any two points on the surface is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate;
   a first semiconductor device disposed on the substrate; and
   a first alignment structure disposed on the substrate,
   wherein the first alignment structure is in direct contact with the first semiconductor device, and the first alignment structure encloses the first semiconductor device.

2. The semiconductor device package of claim 1, wherein the first semiconductor device has a first surface and a second surface adjacent to the first surface, and the first alignment structure has a first surface and a second surface adjacent to the first surface, wherein the first surface of the first semiconductor device is in direct contact with the first surface of first alignment structure, and wherein the second surface of the first semiconductor device is in direct contact with the second surface of first alignment structure.

3. The semiconductor device package of claim 1, wherein the first alignment structure comprises a rectangular-like wall.

4. The semiconductor device package of claim 1, wherein the first semiconductor device is disposed adjacent to a first corner of the first alignment structure.

5. The semiconductor device package of claim 1, further comprising:

a second alignment structure disposed on the substrate; and a second semiconductor device disposed on the substrate, wherein the second alignment structure is in direct contact with the second semiconductor device.

6. The semiconductor device package of claim 5, wherein the first semiconductor device is disposed adjacent to a first corner of the first alignment structure, and the second semiconductor device is disposed adjacent to a first corner of the second alignment structure, wherein the first corner of the second alignment structure is adjacent to a second corner of the first alignment structure, and wherein the second corner of the first alignment structure is opposite to the first corner of the first alignment structure.

7. The semiconductor device package of claim 5, wherein a distance between the first semiconductor device and the second semiconductor device is equal to or less than 2 mm.

8. The semiconductor device package of claim 1, wherein the first alignment structure comprises optical curable material.

9. The semiconductor device package of claim 1, further comprising:
   a first conductive structure disposed on the substrate;
   a first conductive structure disposed on the first semiconductor device; and
   a first connection element disposed between the first conductive structure disposed on the substrate and the first conductive structure disposed on the first semiconductor device,
   wherein the first connection element has a relatively great volume at a first side.

10. The semiconductor device package of claim 1, further comprising:
    a first conductive structure disposed on the substrate; and
    a first conductive structure disposed on the first semiconductor device,
    wherein an axis passing through a center of the first conductive structure disposed on the substrate has a first projection on the substrate, and an axis passing through a center of the first conductive structure disposed on the first semiconductor device has a second projection on the substrate, and wherein a distance between the first projection and the second projection is equal to or less than 1 micro meter (µm).

11. The semiconductor device package of claim 1, further comprising:
    an encapsulant encapsulating the first semiconductor device and the first alignment structure.

12. The semiconductor device package of claim 11, further comprising:
    a second semiconductor device disposed on the first encapsulant; and
    a second alignment structure disposed on the first encapsulant,
    wherein the second semiconductor device is in direct contact with the second alignment structure.

13. The semiconductor device package of claim 11, wherein a portion of the encapsulant is disposed between the first semiconductor device and the first alignment structure.

14. The semiconductor device package of claim 1, further comprising:
    a first conductive structure disposed on the substrate;
    a first conductive structure disposed on the first semiconductor device; and
    a first connection element disposed between the first conductive structure disposed on the substrate and the first conductive structure disposed on the first semiconductor device,
    wherein the first connection element has an asymmetrical shape.

15. The semiconductor device package of claim 9, wherein the first conductive structure is a conductive pillar or a conductive pad.

16. The semiconductor device package of claim 9, wherein the relatively great volume of the first connection element is adjacent to the first alignment structure.

17. The semiconductor device package of claim 9, wherein the relatively great volume of the first connection element is adjacent to a corner of the first alignment structure.

18. The semiconductor device package of claim 12, wherein a bottom portion of the second alignment structure is substantially vertical to the first encapsulant.

19. The semiconductor device package of claim 12, further comprising:
    a second encapsulant disposed on the first encapsulant, wherein the second encapsulant covers the second semiconductor device and the second alignment structure.

* * * * *